US008164343B2

(12) United States Patent
Bertness

(10) Patent No.: US 8,164,343 B2
(45) Date of Patent: Apr. 24, 2012

(54) METHOD AND APPARATUS FOR MEASURING A PARAMETER OF A VEHICLE ELECTRICAL SYSTEM

(75) Inventor: Kevin I. Bertness, Batavia, IL (US)

(73) Assignee: Midtronics, Inc., Willowbrook, IL (US)

( * ) Notice: Subject to any disclaimer, the term of this patent is extended or adjusted under 35 U.S.C. 154(b) by 307 days.

(21) Appl. No.: 12/261,336

(22) Filed: Oct. 30, 2008

(65) Prior Publication Data
US 2009/0051365 A1 Feb. 26, 2009

Related U.S. Application Data

(60) Continuation-in-part of application No. 11/641,594, filed on Dec. 19, 2006, which is a division of application No. 10/656,526, filed on Sep. 5, 2003, now Pat. No. 7,154,276.

(51) Int. Cl.
*G01R 31/00* (2006.01)
*G01R 31/02* (2006.01)
*G01R 27/08* (2006.01)

(52) U.S. Cl. .................. 324/503; 324/543; 324/713
(58) Field of Classification Search ............ 324/503, 324/538, 543, 691, 713, 426
See application file for complete search history.

(56) References Cited

U.S. PATENT DOCUMENTS

| | | | |
|---|---|---|---|
| 85,553 A * | 1/1869 | Adams | 33/472 |
| 2,000,665 A | 5/1935 | Neal | 439/440 |
| 2,417,940 A | 3/1947 | Lehman | 200/61.25 |
| 2,514,745 A | 7/1950 | Dalzell | 324/115 |
| 2,727,221 A | 12/1955 | Springg | 340/447 |
| 3,267,452 A | 12/1963 | Wolf | 340/249 |
| 3,223,969 A | 12/1965 | Alexander | 340/447 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |

(Continued)

FOREIGN PATENT DOCUMENTS
DE  29 26 716 B1  1/1981
(Continued)

OTHER PUBLICATIONS

"Electrochemical Impedance Spectroscopy in Battery Development and Testing", *Batteries International*, Apr. 1997, pp. 59 and 62-63.

(Continued)

*Primary Examiner* — Timothy J Dole
(74) *Attorney, Agent, or Firm* — Westman, Champlin & Kelly, P.A.

(57) ABSTRACT

An automotive vehicle electrical system tester is provided for testing an electrical system having wiring which couple a load to a battery. The automotive vehicle electrical system tester is configured to measure an electrical parameter of the wiring and includes a first battery terminal connection configured to couple to a first terminal of the battery. A test connection is configured to couple to a wire of the electrical system which extends between the first terminal of the battery and the load. Test circuitry coupled to the first battery terminal connection and the test connection is configured to draw current from the battery along a path through the wire and to the test connection. The test circuitry measures an electrical parameter of the wire.

36 Claims, 7 Drawing Sheets

U.S. PATENT DOCUMENTS

| | | | |
|---|---|---|---|
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,776,177 A | 12/1973 | Bryant et al. | 116/311 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/430 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |
| 3,936,744 A | 2/1976 | Perlmutter | 324/772 |
| 3,946,299 A | 3/1976 | Christianson et al. | 320/430 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/724 |
| 4,023,882 A | 5/1977 | Pettersson | 439/426 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,056,764 A | 11/1977 | Endo et al. | 320/101 |
| 4,057,313 A | 11/1977 | Polizzano | 439/219 |
| 4,070,624 A | 1/1978 | Taylor | 324/772 |
| 4,086,531 A | 4/1978 | Bernier | 324/772 |
| 4,106,025 A | 8/1978 | Katz | 343/715 |
| 4,112,351 A | 9/1978 | Back et al. | 324/380 |
| 4,114,083 A | 9/1978 | Benham et al. | 340/636.13 |
| 4,126,874 A | 11/1978 | Suzuki et al. | 396/301 |
| 4,160,916 A | 7/1979 | Papasideris | 307/10.6 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 702/63 |
| 4,280,457 A | 7/1981 | Bloxham | 123/198 R |
| 4,297,639 A | 10/1981 | Branham | 324/429 |
| 4,307,342 A | 12/1981 | Peterson | 324/767 |
| 4,315,204 A | 2/1982 | Sievers et al. | 322/28 |
| 4,316,185 A | 2/1982 | Watrous et al. | 340/636.11 |
| 4,322,685 A | 3/1982 | Frailing et al. | 324/430 |
| 4,351,405 A | 9/1982 | Fields et al. | 180/65.2 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Buckler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,385,269 A | 5/1983 | Aspinwall et al. | 320/129 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/472 |
| 4,514,694 A | 4/1985 | Finger | 324/429 |
| 4,520,353 A | 5/1985 | McAuliffe | 340/636.16 |
| 4,521,498 A | 6/1985 | Juergens | 429/59 |
| 4,564,798 A | 1/1986 | Young | 320/103 |
| 4,620,767 A | 11/1986 | Woolf | 439/217 |
| 4,633,418 A | 12/1986 | Bishop | 702/63 |
| 4,637,359 A | 1/1987 | Cook | 123/179 |
| 4,659,977 A | 4/1987 | Kissel et al. | 320/150 |
| 4,663,580 A | 5/1987 | Wortman | 320/153 |
| 4,665,370 A | 5/1987 | Holland | 324/429 |
| 4,667,143 A | 5/1987 | Cooper et al. | 320/153 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,686,442 A | 8/1987 | Radomski | 320/123 |
| 4,697,134 A | 9/1987 | Burkum et al. | 320/134 |
| 4,707,795 A | 11/1987 | Alber et al. | 702/63 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/125 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. et al. | 320/153 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/106 |
| 4,881,038 A | 11/1989 | Champlin | 324/426 |
| 4,885,523 A | 12/1989 | Koench | 230/131 |
| 4,888,716 A | 12/1989 | Ueno | 702/63 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/406.32 |
| 4,926,330 A | 5/1990 | Abe et al. | 701/33 |
| 4,929,931 A | 5/1990 | McCuen | 340/636.15 |
| 4,931,738 A | 6/1990 | MacIntyre et al. | 324/435 |
| 4,932,905 A | 6/1990 | Richards | 439/822 |
| 4,933,845 A | 6/1990 | Hayes | 710/104 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/129 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Kuznicki | 340/636.15 |
| 5,034,893 A | 7/1991 | Fisher | 701/99 |
| 5,037,778 A | 8/1991 | Stark et al. | 228/121 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/159 |
| 5,194,799 A | 3/1993 | Tomantschger | 320/103 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,278,759 A | 1/1994 | Berra et al. | 701/1 |
| 5,281,919 A | 1/1994 | Palanisamy | 324/427 |
| 5,281,920 A | 1/1994 | Wurst | 324/430 |
| 5,295,078 A | 3/1994 | Stich et al. | 700/297 |
| 5,298,797 A | 3/1994 | Redl | 327/387 |
| 5,300,874 A | 4/1994 | Shimamoto et al. | 320/106 |

| Patent No. | Kind | Date | Inventor(s) | Class/Subclass |
|---|---|---|---|---|
| 5,302,902 | A | 4/1994 | Groehl | 324/434 |
| 5,313,152 | A | 5/1994 | Wozniak et al. | 320/118 |
| 5,315,287 | A | 5/1994 | Sol | 340/455 |
| 5,321,626 | A | 6/1994 | Palladino | 702/63 |
| 5,321,627 | A | 6/1994 | Reher | 702/63 |
| 5,323,337 | A | 6/1994 | Wilson et al. | 702/73 |
| 5,325,041 | A | 6/1994 | Briggs | 320/149 |
| 5,331,268 | A | 7/1994 | Patino et al. | 320/158 |
| 5,332,927 | A | 7/1994 | Paul et al. | 307/66 |
| 5,336,993 | A | 8/1994 | Thomas et al. | 324/158.1 |
| 5,338,515 | A | 8/1994 | Dalla Betta et al. | 422/95 |
| 5,339,018 | A | 8/1994 | Brokaw | 320/147 |
| 5,343,380 | A | 8/1994 | Champlin | 363/46 |
| 5,347,163 | A | 9/1994 | Yoshimura | 307/66 |
| 5,352,968 | A | 10/1994 | Reni et al. | 320/136 |
| 5,357,519 | A | 10/1994 | Martin et al. | 371/15.1 |
| 5,365,160 | A | 11/1994 | Leppo et al. | 320/160 |
| 5,365,453 | A | 11/1994 | Startup et al. | 702/36 |
| 5,369,364 | A | 11/1994 | Renirie et al. | 324/430 |
| 5,381,096 | A | 1/1995 | Hirzel | 324/427 |
| 5,387,871 | A | 2/1995 | Tsai | 324/429 |
| 5,402,007 | A | 3/1995 | Center et al. | 290/40 B |
| 3,178,686 | A | 4/1995 | Mills | 340/447 |
| 5,410,754 | A | 4/1995 | Klotzbach et al. | 370/466 |
| 5,412,308 | A | 5/1995 | Brown | 323/267 |
| 5,412,323 | A | 5/1995 | Kato et al. | 324/429 |
| 5,425,041 | A | 6/1995 | Seko et al. | 372/45.01 |
| 5,426,371 | A | 6/1995 | Salley et al. | 324/429 |
| 5,426,416 | A | 6/1995 | Jefferies et al. | 340/664 |
| 5,430,645 | A | 7/1995 | Keller | 364/424.01 |
| 5,432,025 | A | 7/1995 | Cox | 29/65 |
| 5,432,426 | A | 7/1995 | Yoshida | 320/160 |
| 5,434,495 | A | 7/1995 | Toko | 320/135 |
| 5,435,185 | A | 7/1995 | Eagan | 73/587 |
| 5,442,274 | A | 8/1995 | Tamai | 320/146 |
| 5,445,026 | A | 8/1995 | Eagan | 73/591 |
| 5,449,996 | A | 9/1995 | Matsumoto et al. | 320/148 |
| 5,449,997 | A | 9/1995 | Gilmore et al. | 320/148 |
| 5,451,881 | A | 9/1995 | Finger | 324/433 |
| 5,453,027 | A | 9/1995 | Buell et al. | 439/433 |
| 5,457,377 | A | 10/1995 | Jonsson | 324/430 |
| 5,459,660 | A | 10/1995 | Berra | 701/33 |
| 5,469,043 | A | 11/1995 | Cherng et al. | 320/161 |
| 5,485,090 | A | 1/1996 | Stephens | 324/433 |
| 5,488,300 | A | 1/1996 | Jamieson | 324/432 |
| 5,504,674 | A | 4/1996 | Chen et al. | 705/4 |
| 5,508,599 | A | 4/1996 | Koenck | 320/138 |
| 5,519,383 | A | 5/1996 | De La Rosa | 340/636.15 |
| 5,528,148 | A | 6/1996 | Rogers | 320/137 |
| 5,537,967 | A | 7/1996 | Tashiro et al. | 123/192.1 |
| 5,541,489 | A | 7/1996 | Dunstan | 320/134 |
| 5,546,317 | A | 8/1996 | Andrieu | 702/63 |
| 5,548,273 | A | 8/1996 | Nicol et al. | 340/443 |
| 5,550,485 | A | 8/1996 | Falk | 324/772 |
| 5,561,380 | A | 10/1996 | Sway-Tin et al. | 324/509 |
| 5,562,501 | A | 10/1996 | Kinoshita et al. | 439/852 |
| 5,563,496 | A | 10/1996 | McClure | 320/128 |
| 5,572,136 | A | 11/1996 | Champlin | 324/426 |
| 5,573,611 | A | 11/1996 | Koch et al. | 152/152.1 |
| 5,574,355 | A | 11/1996 | McShane et al. | 320/161 |
| 5,578,915 | A | 11/1996 | Crouch, Jr. et al. | 324/428 |
| 5,583,416 | A | 12/1996 | Klang | 320/160 |
| 5,585,416 | A | 12/1996 | Audett et al. | 522/35 |
| 5,585,728 | A | 12/1996 | Champlin | 324/427 |
| 5,589,757 | A | 12/1996 | Klang | 320/160 |
| 5,592,093 | A | 1/1997 | Klingbiel | 324/426 |
| 5,592,094 | A | 1/1997 | Ichikawa | 324/427 |
| 5,596,260 | A | 1/1997 | Moravec et al. | 320/135 |
| 5,596,261 | A | 1/1997 | Suyama | 320/152 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/106 |
| 5,614,788 | A | 3/1997 | Mullins et al. | 315/82 |
| 5,621,298 | A | 4/1997 | Harvey | 320/134 |
| 5,633,985 | A | 5/1997 | Severson et al. | 704/267 |
| 5,637,978 | A | 6/1997 | Kellett et al. | 320/104 |
| 5,642,031 | A | 6/1997 | Brotto | 320/156 |
| 5,650,937 | A | 7/1997 | Bounaga | 702/65 |
| 5,652,501 | A | 7/1997 | McClure et al. | 340/636.15 |
| 5,653,659 | A | 8/1997 | Kunibe et al. | 477/111 |
| 5,654,623 | A | 8/1997 | Shiga et al. | 320/106 |
| 5,656,920 | A | 8/1997 | Cherng et al. | 324/431 |
| 5,661,368 | A | 8/1997 | Deol et al. | 315/82 |
| 5,666,040 | A | 9/1997 | Bourbeau | 320/118 |
| 5,675,234 | A | 10/1997 | Greene | 340/636.11 |
| 5,677,077 | A | 10/1997 | Faulk | 429/90 |
| 5,684,678 | A | 11/1997 | Barrett | 363/17 |
| 5,691,621 | A | 11/1997 | Phuoc et al. | 320/134 |
| 5,699,050 | A | 12/1997 | Kanazawa | 340/636.13 |
| 5,701,089 | A | 12/1997 | Perkins | 324/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/116 |
| 5,711,648 | A | 1/1998 | Hammerslag | 414/800 |
| 5,712,795 | A | 1/1998 | Layman et al. | 700/297 |
| 5,717,336 | A | 2/1998 | Basell et al. | 324/430 |
| 5,717,937 | A | 2/1998 | Fritz | 713/300 |
| 5,721,688 | A * | 2/1998 | Bramwell | 324/426 |
| 5,732,074 | A | 3/1998 | Spaur et al. | 370/313 |
| 5,739,667 | A | 4/1998 | Matsuda et al. | 320/128 |
| 5,744,962 | A | 4/1998 | Alber et al. | 324/426 |
| 5,745,044 | A | 4/1998 | Hyatt, Jr. et al. | 340/5.23 |
| 5,747,189 | A | 5/1998 | Perkins | 429/91 |
| 5,747,909 | A | 5/1998 | Syverson et al. | 310/156.56 |
| 5,747,967 | A | 5/1998 | Muljadi et al. | 320/148 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,962 | A | 6/1998 | Nor | 320/134 |
| 5,773,978 | A | 6/1998 | Becker | 324/430 |
| 5,778,326 | A | 7/1998 | Moroto et al. | 701/22 |
| 5,780,974 | A | 7/1998 | Pabla et al. | 315/82 |
| 5,780,980 | A | 7/1998 | Naito | 318/139 |
| 5,789,899 | A | 8/1998 | van Phuoc et al. | 320/112 |
| 5,793,359 | A | 8/1998 | Ushikubo | 345/169 |
| 5,796,239 | A | 8/1998 | van Phuoc et al. | 320/107 |
| 5,808,469 | A | 9/1998 | Kopera | 324/434 |
| 5,811,979 | A | 9/1998 | Rhein | 324/718 |
| 5,818,201 | A | 10/1998 | Stockstad et al. | 320/119 |
| 5,818,234 | A | 10/1998 | McKinnon | 324/433 |
| 5,820,407 | A | 10/1998 | Morse et al. | 439/504 |
| 5,821,756 | A | 10/1998 | McShane et al. | 324/430 |
| 5,821,757 | A | 10/1998 | Alvarez et al. | 324/434 |
| 5,825,174 | A | 10/1998 | Parker | 324/106 |
| 5,831,435 | A | 11/1998 | Troy | 324/426 |
| 5,832,396 | A | 11/1998 | Moroto et al. | 701/22 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,871,858 | A | 2/1999 | Thomsen et al. | 429/7 |
| 5,872,443 | A | 2/1999 | Williamson | 320/160 |
| 5,872,453 | A | 2/1999 | Shimoyama et al. | 324/431 |
| 5,883,306 | A | 3/1999 | Hwang | 73/146.8 |
| 5,895,440 | A | 4/1999 | Proctor et al. | 702/63 |
| 5,903,154 | A | 5/1999 | Zhang et al. | 324/437 |
| 5,903,716 | A | 5/1999 | Kimber et al. | 395/114 |
| 5,912,534 | A | 6/1999 | Benedict | 315/82 |
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | 320/122 |
| 5,945,829 | A | 8/1999 | Bertness | 324/430 |
| 5,946,605 | A | 8/1999 | Takahisa et al. | 455/68 |
| 5,950,144 | A | 9/1999 | Hall et al. | 702/183 |
| 5,951,229 | A | 9/1999 | Hammerslag | 414/398 |
| 5,955,951 | A | 9/1999 | Wischerop et al. | 340/572.8 |
| 5,961,561 | A | 10/1999 | Wakefield, II | 701/29 |
| 5,961,604 | A | 10/1999 | Anderson et al. | 709/229 |
| 5,969,625 | A | 10/1999 | Russo | 340/636.19 |
| 5,973,598 | A | 10/1999 | Beigel | 340/572.1 |
| 5,978,805 | A | 11/1999 | Carson | 707/10 |
| 5,982,138 | A | 11/1999 | Krieger | 320/105 |
| 5,990,664 | A | 11/1999 | Rahman | 320/136 |
| 6,002,238 | A | 12/1999 | Champlin | 320/134 |
| 6,005,489 | A | 12/1999 | Siegle et al. | 340/825.69 |
| 6,005,759 | A | 12/1999 | Hart et al. | 361/66 |

| Patent | Date | Inventor | Class |
|---|---|---|---|
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A * | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/433 |
| D442,503 S | 5/2001 | Lundbeck et al. | D10/77 |
| 6,225,808 B1 | 5/2001 | Varghese et al. | 324/426 |
| 6,236,186 B1 | 5/2001 | Helton et al. | 320/106 |
| 6,236,332 B1 | 5/2001 | Conkright et al. | 340/3.1 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/762 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,285,191 B1 * | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 320/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/436 |
| 6,417,669 B1 | 7/2002 | Champlin | 324/426 |
| 6,420,852 B1 | 7/2002 | Sato | 320/134 |
| 6,424,157 B1 | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 | 5/2003 | Roberts et al. | 324/378 |
| 6,577,107 B2 | 6/2003 | Kechmire | 320/139 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |
| 6,738,697 B2 | 5/2004 | Breed | 701/29 |
| 6,740,990 B2 | 5/2004 | Tozuka et al. | 307/9.1 |
| 6,744,149 B1 | 6/2004 | Karuppana et al. | 307/11 |

| Patent No. | Date | Inventor | Class |
|---|---|---|---|
| 6,745,153 B2 | 6/2004 | White et al. | 702/184 |
| 6,759,849 B2 | 7/2004 | Bertness | 324/426 |
| 6,771,073 B2 * | 8/2004 | Henningson et al. | 324/426 |
| 6,777,945 B2 | 8/2004 | Roberts et al. | 324/426 |
| 6,781,382 B2 | 8/2004 | Johnson | 324/426 |
| 6,784,635 B2 | 8/2004 | Larson | 320/104 |
| 6,784,637 B2 | 8/2004 | Raichle et al. | 320/107 |
| 6,788,025 B2 | 9/2004 | Bertness et al. | 320/104 |
| 6,795,782 B2 | 9/2004 | Bertness et al. | 702/63 |
| 6,796,841 B1 | 9/2004 | Cheng et al. | 439/620.3 |
| 6,805,090 B2 | 10/2004 | Bertness et al. | 123/198 |
| 6,806,716 B2 | 10/2004 | Bertness et al. | 324/426 |
| 6,825,669 B2 | 11/2004 | Raichle et al. | 324/426 |
| 6,842,707 B2 | 1/2005 | Raichle et al. | 702/62 |
| 6,845,279 B1 | 1/2005 | Gilmore et al. | 700/115 |
| 6,850,037 B2 | 2/2005 | Bertness | 320/132 |
| 6,856,972 B1 | 2/2005 | Yun et al. | 705/36 R |
| 6,871,151 B2 | 3/2005 | Bertness | 702/63 |
| 6,885,195 B2 | 4/2005 | Bertness | 324/426 |
| 6,888,468 B2 | 5/2005 | Bertness | 340/636.15 |
| 6,891,378 B2 | 5/2005 | Bertness et al. | 324/426 |
| 6,904,796 B2 | 6/2005 | Pacsai et al. | 73/146.8 |
| 6,906,522 B2 | 6/2005 | Bertness et al. | 324/426 |
| 6,906,523 B2 | 6/2005 | Bertness et al. | 324/426 |
| 6,906,624 B2 | 6/2005 | McClelland et al. | 340/442 |
| 6,909,287 B2 | 6/2005 | Bertness | 324/427 |
| 6,909,356 B2 | 6/2005 | Brown et al. | 340/3.2 |
| 6,913,483 B2 | 7/2005 | Restaino et al. | 439/504 |
| 6,914,413 B2 | 7/2005 | Bertness et al. | 320/104 |
| 6,919,725 B2 | 7/2005 | Bertness et al. | 324/433 |
| 6,930,485 B2 | 8/2005 | Bertness et al. | 324/426 |
| 6,933,727 B2 | 8/2005 | Bertness et al. | 324/426 |
| 6,941,234 B2 | 9/2005 | Bertness et al. | 702/63 |
| 6,967,484 B2 | 11/2005 | Bertness | 324/426 |
| 6,972,662 B1 | 12/2005 | Ohkawa et al. | 340/10.1 |
| 6,998,847 B2 | 2/2006 | Bertness et al. | 324/426 |
| 7,003,410 B2 | 2/2006 | Bertness et al. | 702/63 |
| 7,003,411 B2 | 2/2006 | Bertness | 702/63 |
| 7,012,433 B2 | 3/2006 | Smith et al. | 324/426 |
| 7,015,674 B2 | 3/2006 | Vonderhaar | 320/103 |
| 7,029,338 B1 | 4/2006 | Orange et al. | 439/755 |
| 7,034,541 B2 | 4/2006 | Bertness et al. | 324/426 |
| 7,039,533 B2 | 5/2006 | Bertness et al. | 702/63 |
| 7,058,525 B2 | 6/2006 | Bertness et al. | 702/63 |
| 7,081,755 B2 | 7/2006 | Klang et al. | 324/426 |
| 7,089,127 B2 | 8/2006 | Thibedeau et al. | 702/63 |
| 7,098,666 B2 | 8/2006 | Patino | 324/433 |
| 7,102,556 B2 | 9/2006 | White | 341/141 |
| 7,106,070 B2 | 9/2006 | Bertness et al. | 324/538 |
| 7,116,109 B2 | 10/2006 | Klang | 324/426 |
| 7,119,686 B2 | 10/2006 | Bertness et al. | 340/572.1 |
| 7,120,488 B2 | 10/2006 | Nova et al. | 600/2 |
| 7,126,341 B2 | 10/2006 | Bertness et al. | 324/426 |
| 7,129,706 B2 | 10/2006 | Kalley | 324/426 |
| 7,154,276 B2 | 12/2006 | Bertness | 324/503 |
| 7,177,925 B2 | 2/2007 | Carcido et al. | 709/223 |
| 7,182,147 B2 | 2/2007 | Cutler et al. | 173/1 |
| 7,184,905 B2 | 2/2007 | Stefan | 702/63 |
| 7,198,510 B2 | 4/2007 | Bertness | 439/500 |
| 7,200,424 B2 | 4/2007 | Tischer et al. | 455/567 |
| 7,208,914 B2 | 4/2007 | Klang | 320/132 |
| 7,209,850 B2 * | 4/2007 | Brott et al. | 324/426 |
| 7,209,860 B2 | 4/2007 | Trsar et al. | 702/183 |
| 7,212,887 B2 | 5/2007 | Shah et al | 700/276 |
| 7,219,023 B2 | 5/2007 | Banke et al. | 702/58 |
| 7,233,128 B2 | 6/2007 | Brost et al. | 320/132 |
| 7,235,977 B2 | 6/2007 | Koran et al. | 324/426 |
| 7,246,015 B2 | 7/2007 | Bertness et al. | 702/63 |
| 7,272,519 B2 | 9/2007 | Lesesky et al. | 702/63 |
| 7,287,001 B1 | 10/2007 | Falls et al. | 705/22 |
| 7,295,936 B2 | 11/2007 | Bertness et al. | 702/63 |
| 7,319,304 B2 | 1/2008 | Veloo et al. | 320/132 |
| 7,339,477 B2 | 3/2008 | Puzio et al. | 340/572.1 |
| 7,363,175 B2 | 4/2008 | Bertness et al. | 702/63 |
| 7,398,176 B2 | 7/2008 | Bertness | 702/140 |
| 7,408,358 B2 | 8/2008 | Knopf | 324/426 |
| 7,425,833 B2 | 9/2008 | Bertness et al. | 324/426 |
| 7,446,536 B2 | 11/2008 | Bertness | 324/426 |
| 7,453,238 B2 | 11/2008 | Melichar | 320/132 |
| 7,479,763 B2 | 1/2009 | Bertness | 320/134 |
| 7,498,767 B2 | 3/2009 | Brown et al. | 320/107 |
| 7,501,795 B2 | 3/2009 | Bertness et al. | 320/134 |
| 7,505,856 B2 | 3/2009 | Restaino et al. | 702/63 |
| 7,545,146 B2 | 6/2009 | Klang et al. | 324/426 |
| 7,557,586 B1 | 7/2009 | Vonderhaar et al. | 324/437 |
| 7,595,643 B2 | 9/2009 | Klang | 324/426 |
| 7,598,699 B2 | 10/2009 | Restaino et al. | 320/105 |
| 7,598,743 B2 | 10/2009 | Bertness | 324/426 |
| 7,598,744 B2 | 10/2009 | Bertness et al. | 324/426 |
| 7,619,417 B2 | 11/2009 | Klang | 324/427 |
| 7,642,786 B2 | 1/2010 | Philbrook | 324/426 |
| 7,642,787 B2 | 1/2010 | Bertness et al. | 324/426 |
| 7,656,162 B2 | 2/2010 | Vonderhaar et al. | 324/426 |
| 7,657,386 B2 | 2/2010 | Thibedeau et al. | 702/63 |
| 7,679,325 B2 | 3/2010 | Seo | 320/116 |
| 7,688,074 B2 | 3/2010 | Cox et al. | 324/426 |
| 7,698,179 B2 | 4/2010 | Leung et al. | 705/28 |
| 7,705,602 B2 | 4/2010 | Bertness | 324/426 |
| 7,706,991 B2 | 4/2010 | Bertness et al. | 702/63 |
| 7,710,119 B2 | 5/2010 | Bertness | 324/426 |
| 7,723,993 B2 | 5/2010 | Klang | 324/431 |
| 7,728,597 B2 | 6/2010 | Bertness | 324/426 |
| 7,772,850 B2 | 8/2010 | Bertness | 324/426 |
| 7,774,151 B2 | 8/2010 | Bertness | 702/63 |
| 7,777,612 B2 | 8/2010 | Sampson et al. | 340/426.1 |
| 7,791,348 B2 | 9/2010 | Brown et al. | 324/426 |
| 7,808,375 B2 | 10/2010 | Bertness et al. | 340/455 |
| 7,883,002 B2 | 2/2011 | Jin et al. | 235/376 |
| 7,924,015 B2 | 4/2011 | Bertness | 324/426 |
| 2001/0035737 A1 | 11/2001 | Nakanishi et al. | 320/122 |
| 2002/0004694 A1 | 1/2002 | McLeod | 701/29 |
| 2002/0010558 A1 | 1/2002 | Bertness et al. | 702/63 |
| 2002/0021135 A1 | 2/2002 | Li et al. | 324/677 |
| 2002/0030495 A1 | 3/2002 | Kechmire | 324/427 |
| 2002/0041175 A1 | 4/2002 | Lauper et al. | 320/106 |
| 2002/0044050 A1 | 4/2002 | Derbyshire et al. | 340/442 |
| 2002/0050163 A1 | 5/2002 | Makhija et al. | 73/116 |
| 2002/0074392 A1 | 6/2002 | Lancos et al. | 235/382 |
| 2002/0118111 A1 | 8/2002 | Brown et al. | 340/573.1 |
| 2002/0171428 A1 | 11/2002 | Bertness | 702/63 |
| 2002/0176010 A1 | 11/2002 | Wallach et al. | 348/362 |
| 2003/0009270 A1 | 1/2003 | Breed | 701/29 |
| 2003/0025481 A1 | 2/2003 | Bertness | 324/427 |
| 2003/0036909 A1 | 2/2003 | Kato | 704/275 |
| 2003/0040873 A1 | 2/2003 | Lesesky et al. | 702/57 |
| 2003/0078743 A1 | 4/2003 | Bertness et al. | 702/63 |
| 2003/0088375 A1 | 5/2003 | Bertness et al. | 702/63 |
| 2003/0128036 A1 * | 7/2003 | Henningson et al. | 324/426 |
| 2003/0137277 A1 | 7/2003 | Mori et al. | 320/132 |
| 2003/0169018 A1 | 9/2003 | Berels et al. | 320/132 |
| 2003/0169019 A1 | 9/2003 | Oosaki | 320/132 |
| 2003/0184262 A1 | 10/2003 | Makhija | 320/156 |
| 2003/0184306 A1 | 10/2003 | Bertness et al. | 324/426 |
| 2003/0187556 A1 | 10/2003 | Suzuki | 701/29 |
| 2003/0194672 A1 | 10/2003 | Roberts et al. | 431/196 |
| 2003/0197512 A1 | 10/2003 | Miller et al. | 324/426 |
| 2003/0212311 A1 | 11/2003 | Nova et al. | 600/300 |
| 2003/0214395 A1 | 11/2003 | Flowerday et al. | 340/445 |
| 2004/0000590 A1 | 1/2004 | Raichle et al. | 235/462.01 |
| 2004/0000891 A1 | 1/2004 | Raichle et al. | 320/107 |
| 2004/0000893 A1 | 1/2004 | Raichle et al. | 320/135 |
| 2004/0000913 A1 | 1/2004 | Raichle et al. | 324/426 |
| 2004/0000915 A1 | 1/2004 | Raichle et al. | 324/522 |
| 2004/0002824 A1 | 1/2004 | Raichle et al. | 702/63 |
| 2004/0002825 A1 | 1/2004 | Raichle et al. | 702/63 |
| 2004/0002836 A1 | 1/2004 | Raichle et al. | 702/188 |
| 2004/0032264 A1 | 2/2004 | Schoch | 324/426 |
| 2004/0044452 A1 | 3/2004 | Bauer et al. | 703/33 |
| 2004/0049361 A1 | 3/2004 | Hamdan et al. | 702/115 |
| 2004/0051533 A1 | 3/2004 | Namaky | 324/426 |
| 2004/0054503 A1 | 3/2004 | Namaky | 702/183 |
| 2004/0113588 A1 | 6/2004 | Mikuriya et al. | 320/128 |
| 2004/0145342 A1 | 7/2004 | Lyon | 320/108 |
| 2004/0164706 A1 | 8/2004 | Osborne | 320/116 |
| 2004/0178185 A1 | 9/2004 | Yoshikawa et al. | 219/270 |
| 2004/0199343 A1 | 10/2004 | Cardinal et al. | 702/63 |
| 2004/0227523 A1 | 11/2004 | Namky | 324/537 |
| 2004/0239332 A1 | 12/2004 | Mackel et al. | 324/426 |

| | | | | | | | |
|---|---|---|---|---|---|---|---|
| 2004/0251876 A1 | 12/2004 | Bertness et al. | 320/136 | WO | WO 99/56121 | | 11/1999 |
| 2005/0007068 A1 | 1/2005 | Johnson et al. | 320/110 | WO | WO 00/16083 | | 3/2000 |
| 2005/0017726 A1 | 1/2005 | Koran et al. | 324/433 | WO | WO 00/62049 | | 10/2000 |
| 2005/0021294 A1 | 1/2005 | Trsar et al. | 702/183 | WO | WO 00/67359 | | 11/2000 |
| 2005/0025299 A1 | 2/2005 | Tischer et al. | 379/199 | WO | WO 01/59443 | | 2/2001 |
| 2005/0043868 A1 | 2/2005 | Mitcham | 701/29 | WO | WO 01/16614 | | 3/2001 |
| 2005/0057256 A1 | 3/2005 | Bertness | 324/424 | WO | WO 01/16615 | | 3/2001 |
| 2005/0073314 A1 | 4/2005 | Bertness et al. | 324/433 | WO | WO 01/51947 | | 7/2001 |
| 2005/0102073 A1 | 5/2005 | Ingram | 701/29 | WO | WO 03/047064 A3 | | 6/2003 |
| 2005/0128083 A1 | 6/2005 | Puzio et al. | 340/572.1 | WO | WO 03/076960 A1 | | 9/2003 |
| 2005/0159847 A1 | 7/2005 | Shah et al. | 700/276 | WO | WO 2004/047215 A1 | | 6/2004 |
| 2005/0168226 A1 | 8/2005 | Quint et al. | 324/426 | | | | |
| 2005/0173142 A1 | 8/2005 | Cutler et al. | 173/181 | | | | |
| 2005/0182536 A1 | 8/2005 | Doyle et al. | 701/29 | | | | |
| 2005/0218902 A1 | 10/2005 | Restaino et al. | 324/433 | | | | |
| 2005/0254106 A9 | 11/2005 | Silverbrook et al. | 358/539 | | | | |
| 2005/0256617 A1 | 11/2005 | Cawthorne et al. | 701/22 | | | | |
| 2005/0258241 A1 | 11/2005 | McNutt et al. | 235/385 | | | | |
| 2006/0012330 A1 | 1/2006 | Okumura et al. | 320/103 | | | | |
| 2006/0030980 A1 | 2/2006 | St. Denis | 701/29 | | | | |
| 2006/0089767 A1 | 4/2006 | Sowa | 701/29 | | | | |
| 2006/0217914 A1 | 9/2006 | Bertness | 702/113 | | | | |
| 2006/0282323 A1 | 12/2006 | Walker et al. | 705/14 | | | | |
| 2007/0024460 A1* | 2/2007 | Clark | 340/663 | | | | |
| 2007/0026916 A1 | 2/2007 | Juds et al. | 463/1 | | | | |
| 2007/0194791 A1* | 8/2007 | Huang | 324/430 | | | | |
| 2008/0303528 A1 | 12/2008 | Kim | 324/430 | | | | |
| 2008/0303529 A1 | 12/2008 | Nakamura et al. | 324/433 | | | | |
| 2009/0247020 A1 | 10/2009 | Gathman et al. | 439/759 | | | | |
| 2010/0145780 A1 | 6/2010 | Nishikawa et al. | 705/14.11 | | | | |
| 2010/0314950 A1 | 12/2010 | Rutkowski et al. | 307/125 | | | | |
| 2011/0004427 A1 | 1/2011 | Gorbold et al. | 702/63 | | | | |

FOREIGN PATENT DOCUMENTS

| | | |
|---|---|---|
| DE | 196 38 324 | 9/1996 |
| DE | 19638324 | 9/1996 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |

OTHER PUBLICATIONS

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice for Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5.

Burr-Brown Corporation, "Design A 60 Hz Notch Filter with the UAF42", Jan. 1994, AB-071.

National Semiconductor Corporation, "LMF90-$4^{th}$-Order Elliptic Notch Filter", Dec. 1994, RRD-B30M115.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articies/DC-DC/converter.shtm, undated.

"Notification of Transmittal of the International Search Report or the Declaration", PCT/US02/29461.

"Notification of Transmittal of the International Search Report or the Declaration", PCT/US03/07546.

"Notification of Transmittal of the International Search Report or the Declaration", PCT/US03/06577.

"Notification of Transmittal of the International Search Report or the Declaration", PCT/US03/07837.

"Improved Impedance Spectroscopy Technique for Status Determination of Production Li/SO$_2$ Batteries" Terrill Atwater et al., pp. 10-113, (1992).

"Notification of Transmittal of the International Search Report or the Declaration", PCT/US03/41561.

"Notification of Transmittal of the International Search Report or the Declaration", PCT/US03/27696.

"Programming Training Course, 62-000 Series Smart Engine Analyzer", Testproducts Division, Kalamazoo, Michigan, pp. 1-207, (1984).

"Operators Manual, Modular Computer Analyzer Model MCA 3000", Sun Electric Corporation, Crystal Lake, Illinois pp. 1-1-14-13, (1991).

Supplementary European Search Report Communication for Appl. No. 99917402.2.

"Dynamic modelling of lead/acid batteries using impedance spectroscopy for parameter identification", Journal of Power Sources, pp. 69-84, (1997).

Notification of Transmittal of the International Search Report for PCT/US03/30707.

"A review of impedance measurements for determination of the state-of-charge or state-of-health of secondary batteries", Journal of Power Sources, pp. 59-69, (1998).

"Search Report Under Section 17" for Great Britain Application No. GB0421447.4.

"Results of Discrete Frequency Immittance Spectroscopy (DFIS) Measurements of Lead Acid Batteries", by K.S. Champlin et al., *Proceedings of 23rd International Teleco Conference (INTELEC)*, published Oct. 2001, IEE, pp. 433-440.

"Examination Report" from the U.K. Patent Office for U.K. App. No. 0417678.0.

Wikipedia Online Encyclopedia, Inductance, 2005, http://en.wikipedia.org/wiki/inductance, pp. 1-5, mutual Inductance, pp. 3,4.

"Professional BCS System Analyzer Battery-Charger-Starting", pp. 2-8, (2001).

Young Illustrated Encyclopedia Dictionary of Electronics, 1981, Parker Publishing Company, Inc., pp. 318-319.

"Office Action Summary" issued in related U.S. Appl. No. 11/641,594, filed Dec. 19, 2006; 9 pages.

"A Microprocessor-Based Control System for a Near-Term Electric Vehicle", Bimal K. Bose; IEEE Transactions on Industry Applications, vol. IA-17, No. 6, Nov./Dec. 198?,; 0093-9994/81/1100-0626$00.75 © 1981 IEEE, 6 pages.

"DSP Applications in Hybrid Electric Vehicle Powertrain", Miller et al., Proceedings of the American Control Conference, Sand Diego, CA, Jun. 1999; 2 ppg.

"Notification of Transmittal of the International Search Report and the Written Opinion of the International Searching Authority, or the Declaration" for PCT/US2008/008702 filed Jul. 2008; 15 pages.

"Notification Concerning Availability of the Publication of the International Application" for PCT/US2008/008702, filed Jul. 17, 2008; 24 pages.

"First Notice Informing the Applicant of the Communication of the International Application (To Designated Offices which do not apply the 30 Month Time Limit Under Article 22(1))" for PCT/US2008/008702 filed Jul. 17, 2008; one page.

"Notification of the Recording of a Change" for PCT/US2008/008702 filed Jul. 17, 2008; one page.

Final Office Action from corresponding U.S. Appl. No. 10/656,526, dated Mar. 10, 2006.

Final Office Action from corresponding U.S. Appl. No. 10/656,526, dated Sep. 22, 2005.

Final Office Action from corresponding U.S. Appl. No. 10/656,526, dated Apr. 4, 2005.

Final Office Action from corresponding U.S. Appl. No. 10/656,526, dated Oct. 5, 2004.

Final Office Action from corresponding U.S. Appl. No. 11/641,594, dated Feb. 28, 2008.

Final Office Action from corresponding U.S. Appl. No. 11/641,594, dated Aug. 25, 2008.

Final Office Action from corresponding U.S. Appl. No. 11/641,594, dated Dec. 11, 2008.

Final Office Action from corresponding U.S. Appl. No. 11/641,594, dated Jun. 1, 2009.

Final Office Action from corresponding U.S. Appl. No. 11/641,594, dated Sep. 15, 2009.

Final Office Action from corresponding U.S. Appl. No. 11/641,594, dated Mar. 5, 2010.

Final Office Action from corresponding U.S. Appl. No. 11/641,594, dated May 24, 2010.

Final Office Action from corresponding U.S. Appl. No. 11/641,594, dated Oct. 29, 2010.

Search Report and Written Opinion from PCT Application No. PCT/US2011/026608, dated Aug. 29, 2011, 9 pgs.

Search Report and Written Opinion from PCT Application No. PCT/US2011/038279, dated Sep. 16, 2011, 12 pgs.

"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).

"Conductance Testing of Standby Batteries in Signaling and Communications Applications for the Purpose of Evaluating Battery State-of-Health", by S. McShane, Apr. 1993, pp. 1-9; (14 total pgs.).

"Condutance Monitoring of Recombination Lead Acid Batteries", by B. Jones, May 1993, pp. 1-6; (11 total pgs.).

"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).

"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).

"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).

"Field Experience of Testing VRLA Batteries by Measuring Conductance", by M.W. Kniveton, May 1994, pp. 1-4; (9 total pgs.).

"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).

"Testing 24 Volt Aircraft Batteries Using Midtronics Conductance Technology", by M. Hlavac et al., Jan. 1995, 9 pgs; (13 total pgs.).

Provisional Application U.S. Appl. No. 60/387,912 filed Jun. 13, 2002 which is related to the U.S. Patent No. 7,089,127.

Notification of Transmittal of the International Search Report and the Written Opinion of the International Searching Authority, or the Declaration for PCT/US2011/038279 filed May 27, 2011, date of mailing Sept. 16, 2011, 12 pages.

"A Microprocessor-Based Control System for a Near-Term Electric Vehicle," Bimal K. Bose; IEEE Transactions on Industry Applications, vol. IA-17, No. 6, Nov./Dec. 1981; 0093-9994/81/1100-0626$00.75 © 1981 IEEE, 6 pages.

"Conductance Testing Compared to Traditional Methods of Evaluating the Capacity of Valve-Regulated Lead-Acid Batteries and Predicting State-of-Health," by D. Feder et al., May 1992, pp. 1-8; (13 total pgs).

"Field and Laboratory Studies to Assess the State of Health and Valve-Regulated Lead Acid Batteries: Part I-Conductance/Capacity Correlation Studies," by D. Feder et al., Oct. 1992, pp. 1-15; (19 total pages.).

* cited by examiner

METHOD AND APPARATUS FOR MEASURING A PARAMETER OF A VEHICLE ELECTRICAL SYSTEM

The present application is a Continuation-In-Part of and claims priority of U.S. patent application Ser. No. 11/641,594, filed Dec. 19, 2006, which is a Divisional of U.S. patent application Ser. No. 10/656,526, filed Sep. 5, 2003, now U.S. Pat. No. 7,154,276, the contents of which are hereby incorporated by reference in their entirety.

BACKGROUND OF THE INVENTION

The present invention relates to the measurement of electrical parameters of a vehicle electrical system. More specifically, the present invention relates to measuring an electrical parameter of an electrical system of a vehicle using a plurality of connections to the electrical system.

Various types of devices related to battery tester, vehicle diagnostics and the like are described in U.S. Pat. No. 3,873,911, issued Mar. 25, 1975, to Champlin; U.S. Pat. No. 3,909,708, issued Sep. 30, 1975, to Champlin; U.S. Pat. No. 4,816,768, issued Mar. 28, 1989, to Champlin; U.S. Pat. No. 4,825,170, issued Apr. 25, 1989, to Champlin; U.S. Pat. No. 4,881,038, issued Nov. 14, 1989, to Champlin; U.S. Pat. No. 4,912,416, issued Mar. 27, 1990, to Champlin; U.S. Pat. No. 5,140,269, issued Aug. 18, 1992, to Champlin; U.S. Pat. No. 5,343,380, issued Aug. 30, 1994; U.S. Pat. No. 5,572,136, issued Nov. 5, 1996; U.S. Pat. No. 5,574,355, issued Nov. 12, 1996; U.S. Pat. No. 5,583,416, issued Dec. 10, 1996; U.S. Pat. No. 5,585,728, issued Dec. 17, 1996; U.S. Pat. No. 5,589,757, issued Dec. 31, 1996; U.S. Pat. No. 5,592,093, issued Jan. 7, 1997; U.S. Pat. No. 5,598,098, issued Jan. 28, 1997; U.S. Pat. No. 5,656,920, issued Aug. 12, 1997; U.S. Pat. No. 5,757,192, issued May 26, 1998; U.S. Pat. No. 5,821,756, issued Oct. 13, 1998; U.S. Pat. No. 5,831,435, issued Nov. 3, 1998; U.S. Pat. No. 5,871,858, issued Feb. 16, 1999; U.S. Pat. No. 5,914,605, issued Jun. 22, 1999; U.S. Pat. No. 5,945,829, issued Aug. 31, 1999; U.S. Pat. No. 6,002,238, issued Dec. 14, 1999; U.S. Pat. No. 6,037,751, issued Mar. 14, 2000; U.S. Pat. No. 6,037,777, issued Mar. 14, 2000; U.S. Pat. No. 6,051,976, issued Apr. 18, 2000; U.S. Pat. No. 6,081,098, issued Jun. 27, 2000; U.S. Pat. No. 6,091,245, issued Jul. 18, 2000; U.S. Pat. No. 6,104,167, issued Aug. 15, 2000; U.S. Pat. No. 6,137,269, issued Oct. 24, 2000; U.S. Pat. No. 6,163,156, issued Dec. 19, 2000; U.S. Pat. No. 6,172,483, issued Jan. 9, 2001; U.S. Pat. No. 6,172,505, issued Jan. 9, 2001; U.S. Pat. No. 6,222,369, issued Apr. 24, 2001; U.S. Pat. No. 6,225,808, issued May 1, 2001; U.S. Pat. No. 6,249,124, issued Jun. 19, 2001; U.S. Pat. No. 6,259,254, issued Jul. 10, 2001; U.S. Pat. No. 6,262,563, issued Jul. 17, 2001; U.S. Pat. No. 6,294,896, issued Sep. 25, 2001; U.S. Pat. No. 6,294,897, issued Sep. 25, 2001; U.S. Pat. No. 6,304,087, issued Oct. 16, 2001; U.S. Pat. No. 6,310,481, issued Oct. 30, 2001; U.S. Pat. No. 6,313,607, issued Nov. 6, 2001; U.S. Pat. No. 6,313,608, issued Nov. 6, 2001; U.S. Pat. No. 6,316,914, issued Nov. 13, 2001; U.S. Pat. No. 6,323,650, issued Nov. 27, 2001; U.S. Pat. No. 6,329,793, issued Dec. 11, 2001; U.S. Pat. No. 6,331,762, issued Dec. 18, 2001; U.S. Pat. No. 6,332,113, issued Dec. 18, 2001; U.S. Pat. No. 6,351,102, issued Feb. 26, 2002; U.S. Pat. No. 6,359,441, issued Mar. 19, 2002; U.S. Pat. No. 6,363,303, issued Mar. 26, 2002; U.S. Pat. No. 6,377,031, issued Apr. 23, 2002; U.S. Pat. No. 6,392,414, issued May 21, 2002; U.S. Pat. No. 6,417,669, issued Jul. 9, 2002; U.S. Pat. No. 6,424,158, issued Jul. 23, 2002; U.S. Pat. No. 6,441,585, issued Aug. 17, 2002; U.S. Pat. No. 6,437,957, issued Aug. 20, 2002; U.S. Pat. No. 6,445,158, issued Sep. 3, 2002; U.S. Pat. Nos. 6,456,045; 6,466,025, issued Oct. 15, 2002; U.S. Pat. No. 6,465,908, issued Oct. 15, 2002; U.S. Pat. No. 6,466,026, issued Oct. 15, 2002; U.S. Pat. No. 6,469,511, issued Nov. 22, 2002; U.S. Pat. No. 6,495,990, issued Dec. 17, 2002; U.S. Pat. No. 6,497,209, issued Dec. 24, 2002; U.S. Pat. No. 6,507,196, issued Jan. 14, 2003; U.S. Pat. No. 6,534,993; issued Mar. 18, 2003; U.S. Pat. No. 6,544,078, issued Apr. 8, 2003; U.S. Pat. No. 6,556,019, issued Apr. 29, 2003; U.S. Pat. No. 6,566,883, issued May 20, 2003; U.S. Pat. No. 6,586,941, issued Jul. 1, 2003; U.S. Pat. No. 6,597,150, issued Jul. 22, 2003; U.S. Pat. No. 6,621,272, issued Sep. 16, 2003; U.S. Pat. No. 6,623,314, issued Sep. 23, 2003; U.S. Pat. No. 6,633,165, issued Oct. 14, 2003; U.S. Pat. No. 6,635,974, issued Oct. 21, 2003; U.S. Pat. No. 6,707,303, issued Mar. 16, 2004; U.S. Pat. No. 6,737,831, issued May 18, 2004; U.S. Pat. No. 6,744,149, issued Jun. 1, 2004; U.S. Pat. No. 6,759,849, issued Jul. 6, 2004; U.S. Pat. No. 6,781,382, issued Aug. 24, 2004; U.S. Pat. No. 6,788,025, filed Sep. 7, 2004; U.S. Pat. No. 6,795,782, issued Sep. 21, 2004; U.S. Pat. No. 6,805,090, filed Oct. 19, 2004; U.S. Pat. No. 6,806,716, filed Oct. 19, 2004; U.S. Pat. No. 6,850,037, filed Feb. 1, 2005; U.S. Pat. No. 6,850,037, issued Feb. 1, 2005; U.S. Pat. No. 6,871,151, issued march 22, 2005; U.S. Pat. No. 6,885,195, issued Apr. 26, 2005; U.S. Pat. No. 6,888,468, issued May 3, 2005; U.S. Pat. No. 6,891,378, issued May 10, 2005; U.S. Pat. No. 6,906,522, issued Jun. 14, 2005; U.S. Pat. No. 6,906,523, issued Jun. 14, 2005; U.S. Pat. No. 6,909,287, issued Jun. 21, 2005; U.S. Pat. No. 6,914,413, issued Jul. 5, 2005; U.S. Pat. No. 6,913,483, issued Jul. 5, 2005; U.S. Pat. No. 6,930,485, issued Aug. 16, 2005; U.S. Pat. No. 6,933,727, issued Aug. 23, 200; U.S. Pat. No. 6,941,234, filed Sep. 6, 2005; U.S. Pat. No. 6,967,484, issued Nov. 22, 2005; U.S. Pat. No. 6,998,847, issued Feb. 14, 2006; U.S. Pat. No. 7,003,410, issued Feb. 21, 2006; U.S. Pat. No. 7,003,411, issued Feb. 21, 2006; U.S. Pat. No. 7,012,433, issued Mar. 14, 2006; U.S. Pat. No. 7,015,674, issued Mar. 21, 2006; U.S. Pat. No. 7,034,541, issued Apr. 25, 2006; U.S. Pat. No. 7,039,533, issued May 2, 2006; U.S. Pat. No. 7,058,525, issued Jun. 6, 2006; U.S. Pat. No. 7,081,755, issued Jul. 25, 2006; U.S. Pat. No. 7,106,070, issued Sep. 12, 2006; U.S. Pat. No. 7,116,109, issued Oct. 3, 2006; U.S. Pat. No. 7,119,686, issued Oct. 10, 2006; and U.S. Pat. No. 7,126,341, issued Oct. 24, 2006; U.S. Pat. No. 7,154,276, issued Dec. 26, 2006; U.S. Pat. No. 7,198,510, issued Apr. 3, 2007; U.S. Pat. No. 7,363,175, issued Apr. 22, 2008; U.S. Pat. No. 7,208,914, issued Apr. 24, 2007; U.S. Pat. No. 7,246,015, issued Jul. 17, 2007; U.S. Pat. No. 7,295,936, issued Nov. 13, 2007; U.S. Pat. No. 7,319,304, issued Jan. 15, 2008; U.S. Pat. No. 7,363,175, issued Apr. 22, 2008; U.S. Pat. No. 7,398,176, issued Jul. 8, 2008; U.S. Pat. No. 7,408,358, issued Aug. 5, 208; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/880,473, filed Jun. 13, 2001; entitled BATTERY TEST MODULE; U.S. Ser. No. 10/042,451, filed Jan. 8, 2002, entitled BATTERY CHARGE CONTROL DEVICE; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,998, filed Mar. 29, 2002, entitled BATTERY TESTER WITH BATTERY REPLACEMENT OUTPUT; U.S. Ser. No. 10/263,473, filed Oct. 2, 2002, entitled ELECTRONIC BATTERY TESTER WITH RELATIVE TEST OUTPUT; U.S. Ser. No. 10/310,385, filed Dec. 5, 2002, entitled BATTERY TEST MODULE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 10/258,441, filed Apr. 9, 2003, entitled CURRENT MEASURING CIRCUIT SUITED FOR BATTERIES; U.S. Ser. No. 10/681,666, filed Oct. 8, 2003, entitled ELECTRONIC BATTERY TESTER WITH PROBE LIGHT; U.S. Ser. No. 10/783,682, filed Feb. 20, 2004, entitled REPLACEABLE CLAMP FOR ELECTRONIC BATTERY TESTER; U.S. Ser. No. 10/791,141, filed Mar. 2, 2004, entitled METHOD AND APPARATUS FOR AUDITING A BATTERY TEST; U.S. Ser. No. 10/867,385, filed Jun. 14, 2004, entitled ENERGY MANAGEMENT SYSTEM FOR AUTOMOTIVE VEHICLE; U.S. Ser. No. 10/896,834, filed Jul. 22, 2004, entitled ELECTRONIC BATTERY TESTER; U.S. Ser. No. 10/958,821, filed Oct. 5, 2004, entitled IN-VEHICLE BATTERY MONITOR; U.S. Ser. No. 10/958,812, filed Oct. 5, 2004, entitled SCAN TOOL FOR ELECTRONIC BATTERY TESTER; U.S. Ser. No. 11/008,456, filed Dec. 9, 2004, entitled APPARATUS AND METHOD FOR PREDICTING BATTERY CAPACITY AND FITNESS FOR SERVICE FROM A BATTERY DYNAMIC PARAMETER AND A RECOVERY VOLTAGE DIFFERENTIAL, U.S. Ser. No. 60/587,232, filed Dec. 14, 2004, entitled CELLTRON ULTRA, U.S. Ser. No. 11/018,785, filed Dec. 21, 2004, entitled WIRELESS BATTERY MONITOR; U.S. Ser. No. 60/653,537, filed Feb. 16, 2005, entitled CUSTOMER MANAGED WARRANTY CODE; U.S. Ser. No. 11/063,247, filed Feb. 22, 2005, entitled ELECTRONIC BATTERY TESTER OR CHARGER WITH DATABUS CONNECTION; U.S. Ser. No. 60/665,070, filed Mar. 24, 2005, entitled OHMMETER PROTECTION CIRCUIT; U.S. Ser. No. 11/141,234, filed May 31, 2005, entitled BATTERY TESTER CAPABLE OF IDENTIFYING FAULTY BATTERY POST ADAPTERS; U.S. Ser. No. 11/143,828, filed Jun. 2, 2005, entitled BATTERY TEST MODULE; U.S. Ser. No. 11/146,608, filed Jun. 7, 2005, entitled SCAN TOOL FOR ELECTRONIC BATTERY TESTER; U.S. Ser. No. 60,694,199, filed Jun. 27, 2005, entitled GEL BATTERY CONDUCTANCE COMPENSATION; U.S. Ser. No. 11/178,550, filed Jul. 11, 2005, entitled WIRELESS BATTERY TESTER/CHARGER; U.S. Ser. No. 60/705,389, filed Aug. 4, 2005, entitled PORTABLE TOOL THEFT PREVENTION SYSTEM, U.S. Ser. No. 11/207,419, filed Aug. 19, 2005, entitled SYSTEM FOR AUTOMATICALLY GATHERING BATTERY INFORMATION FOR USE DURING BATTERY TESTER/CHARGING, U.S. Ser. No. 60/712,322, filed Aug. 29, 2005, entitled AUTOMOTIVE VEHICLE ELECTRICAL SYSTEM DIAGNOSTIC DEVICE, U.S. Ser. No. 60/713,168, filed Aug. 31, 2005, entitled LOAD TESTER SIMULATION WITH DISCHARGE COMPENSATION, U.S. Ser. No. 60/731,881, filed Oct. 31, 2005, entitled PLUG-IN FEATURES FOR BATTERY TESTERS; U.S. Ser. No. 60/731,887, filed Oct. 31, 2005, entitled AUTOMOTIVE VEHICLE ELECTRICAL SYSTEM DIAGNOSTIC DEVICE; U.S. Ser. No. 11/304,004, filed Dec. 14, 2005, entitled BATTERY TESTER THAT CALCULATES ITS OWN REFERENCE VALUES; U.S. Ser. No. 60/751,853, filed Dec. 20, 2005, entitled BATTERY MONITORING SYSTEM; U.S. Ser. No. 11/304,004, filed Dec. 14, 2005, entitled BATTERY TESTER WITH CALCULATES ITS OWN REFERENCE VALUES; U.S. Ser. No. 60/751,853, filed Dec. 20, 2005, entitled BATTERY MONITORING SYSTEM; U.S. Ser. No. 11/356,299, filed Feb. 16, 2006, entitled CENTRALLY MONITORED SALES OF STORAGE BATTERIES; U.S. Ser. No. 11/356,443, filed Feb. 16, 2006, entitled ELECTRONIC BATTERY TESTER WITH NETWORK COMMUNICATION; U.S. Ser. No. 11/498,703, filed Aug. 3, 2006, entitled THEFT PREVENTION DEVICE FOR AUTOMOTIVE VEHICLE SERVICE CENTERS; U.S. Ser. No. 11/507,157, filed Aug. 21, 2006, entitled APPARATUS AND METHOD FOR SIMULATING A BATTERY TESTER WITH A FIXED RESISTANCE LOAD; U.S. Ser. No. 11/511,872, filed Aug. 29, 2006, entitled AUTOMOTIVE VEHICLE ELECTRICAL SYSTEM DIAGNOSTIC DEVICE; U.S. Ser. No. 11/519,481, filed Sep. 12, 2006, entitled BROAD-BAND LOW-CONDUCTANCE CABLES FOR MAKING KELVIN CONNECTIONS TO ELECTROCHEMICAL CELLS AND BATTERIES; U.S. Ser. No. 60/847,064, filed Sep. 25, 2006, entitled STATIONARY BATTERY MONITORING ALGORITHMS; U.S. Ser. No. 11/638,771, filed Dec. 14, 2006, entitled BATTERY MONITORING SYSTEM; U.S. Ser. No. 11/641,594, filed Dec. 19, 2006, entitled METHOD AND APPARATUS FOR MEASURING A PARAMETER OF A VEHICLE ELECTRONIC SYSTEM; U.S. Ser. No. 11/711,356, filed Feb. 27, 2007, entitled BATTERY TESTER WITH PROMOTION FEATURE; U.S. Ser. No. 11/811,528, filed Jun. 11, 2007, entitled ALTERNATOR TESTER; U.S. Ser. No. 60/950,182, filed Jul. 17, 2007, entitled BATTERY TESTER FOR HYBRID VEHICLE; U.S. Ser. No. 60/973,879, filed Sep. 20, 2007, entitled ELECTRONIC BATTERY TESTER FOR TESTING STATIONARY BATTERIES; U.S. Ser. No. 11/931,907, filed Oct. 31, 2007, entitled BATTERY MAINTENANCE WITH PROBE LIGHT; U.S. Ser. No. 60/992,798, filed Dec. 6, 2007, entitled STORAGE BATTERY AND BATTERY TESTER; U.S. Ser. No. 12/099,826, filed Apr. 9, 2008, entitled BATTERY RUN DOWN INDICATOR; U.S. Ser. No. 61/061,848, filed Jun. 16, 2008, entitled KELVIN CLAMP FOR ELECTRONICALLY COUPLING TO A BATTERY CONTACT; U.S. Ser. No. 12/168,264, filed Jul. 7, 2008, entitled BATTERY TESTERS WITH SECONDARY FUNCTIONALITY; U.S. Ser. No. 12/174,894, filed Jul. 17, 2008, entitled BATTERY TESTER FOR ELECTRIC VEHICLE; which are incorporated herein in their entirety.

There is an ongoing need to measure parameters of electrical systems of vehicles and heavy equipment. Such measurements can be used to diagnose operation, failure or impending failure of components or subsystems of electrical systems. For example, in electrical systems used in vehicles, measurement of electrical parameters of such systems can be used to diagnose operation of the system or indicate that maintenance is required before ultimate failure.

One particular measurement is the resistance of cabling used in the vehicle. For example, one such cable or set of cables connects the battery the of vehicle to the starter motor. The starter motor has a relatively large current draw and even a relatively small cable resistance can have a significant impact on operation of the starter motor.

Because the cable resistance is relatively small it typically cannot be measured using a standard ohm meter or other techniques which are normally used to measure resistance. One technique which has been used to measure the cable resistance is to run a very large current through the cable and measure the voltage drop. However, this is cumbersome and requires components capable of handling the large current.

SUMMARY OF THE INVENTION

An automotive vehicle electrical system tester is provided for testing an electrical system having wiring which couple a load to a battery. The automotive vehicle electrical system tester is configured to measure an electrical parameter of the wiring and includes a first battery terminal connection configured to couple to a first terminal of the battery. A test connection is configured to couple to a wire of the electrical system which extends between the first terminal of the battery and the load. Test circuitry coupled to the first battery terminal connection and the test connection is configured to draw current from the battery along a path through the wire and to the test connection. The test circuitry measures an electrical parameter of the wire.

DETAILED DESCRIPTION OF THE PREFERRED EMBODIMENTS

Figure 1:
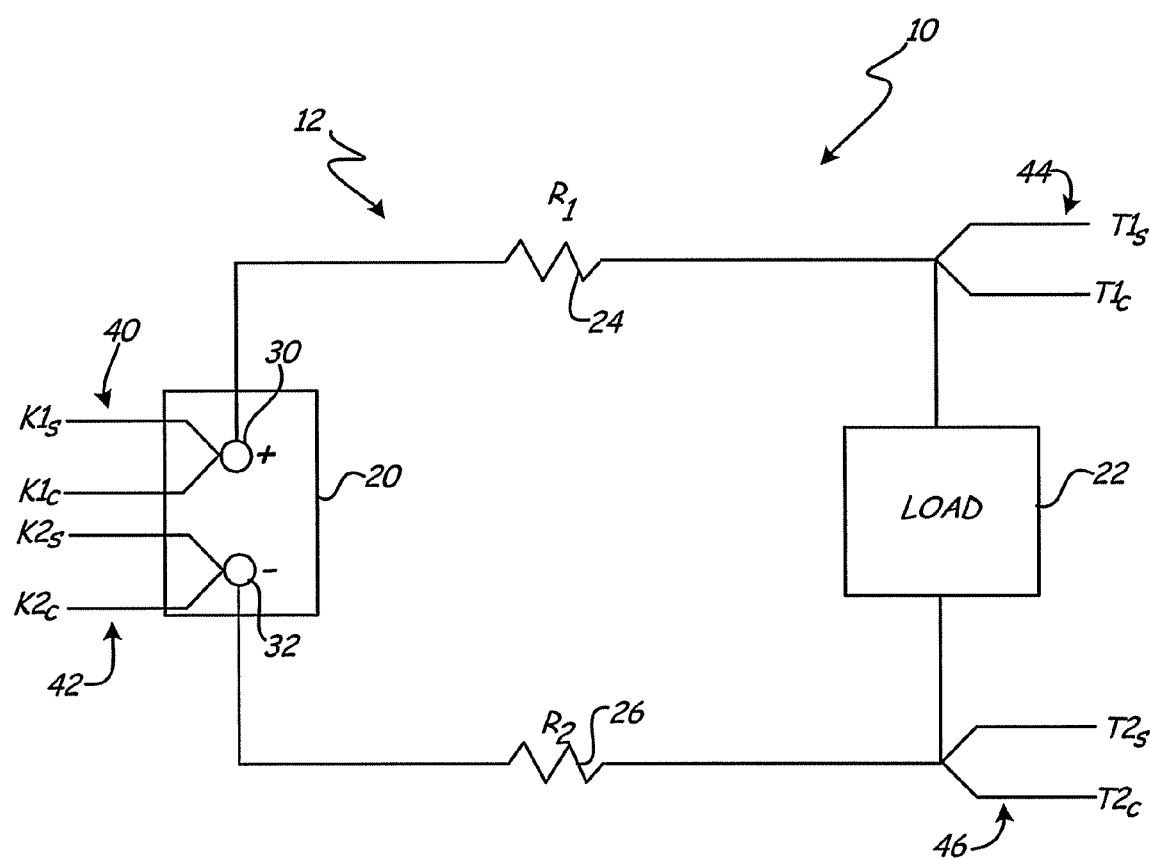
FIG. 1 is a simplified diagram of an electrical system of a vehicle.

FIG. 1 is a simplified diagram of an electrical system 10 of a vehicle 12. Electrical system 10 includes a battery 20, a load 22 and cables 24 and 26 which connect load 22 to the positive terminal 30 of battery 20 and the negative terminal 32 of battery 20, respectively. Cables 24 and 26 are illustrated as having resistances $R_1$ and $R_2$, respectively.

FIG. 1 also shows Kelvin connections 40 and 42 coupled to the positive terminal 30 and the negative terminal 32 of battery 20 respectively.

Kelvin connection 40 has a sense connection $K1_S$ and a current connection $K1_C$. Similarly, Kelvin connection 42 has a sense connection $K2_S$ and a current connection $K2_C$. FIG. 1 also illustrates test connections 44 and 46. In the embodiment of FIG. 1, these are illustrated as being Kelvin connections, however the present invention is not limited to this arrangement. Test connection 44 is connected between load 22 and cable 24. Similarly, test connection 46 is connected between load 22 and cable 26. Test connection 44 includes a sense connection $T1_S$ and a current connection $T1_C$. Test connection 46 includes a sense connection $T2_S$ and a current connection $T2_C$.

As discussed in the Background section, the resistances $R_1$ and $R_2$ of cables 24 or 26 can impact the amount of power which can be delivered to load 22. Even if the resistance values are relatively small, if a relatively large current passes through cables 24 and 26, the resultant voltage drop can significantly reduce the voltage across load 22 and therefore the amount of power which can be delivered to load 22. In many instances, it is desirable to measure the resistance $R_1$ and $R_2$ of cables 24 and 26, respectively, in order to identify a cable with a resistance which is too high. One technique which has been used to measure the resistance of the cables is to pass a large current through the cable and measure the resulting voltage drop across the cable. However, this is a cumbersome test and requires electrical test equipment which is capable of handling the large current draw. The present invention provides an apparatus and technique for measuring the resistance of a cable in a configuration similar to that shown in FIG. 1.

Figure 2:
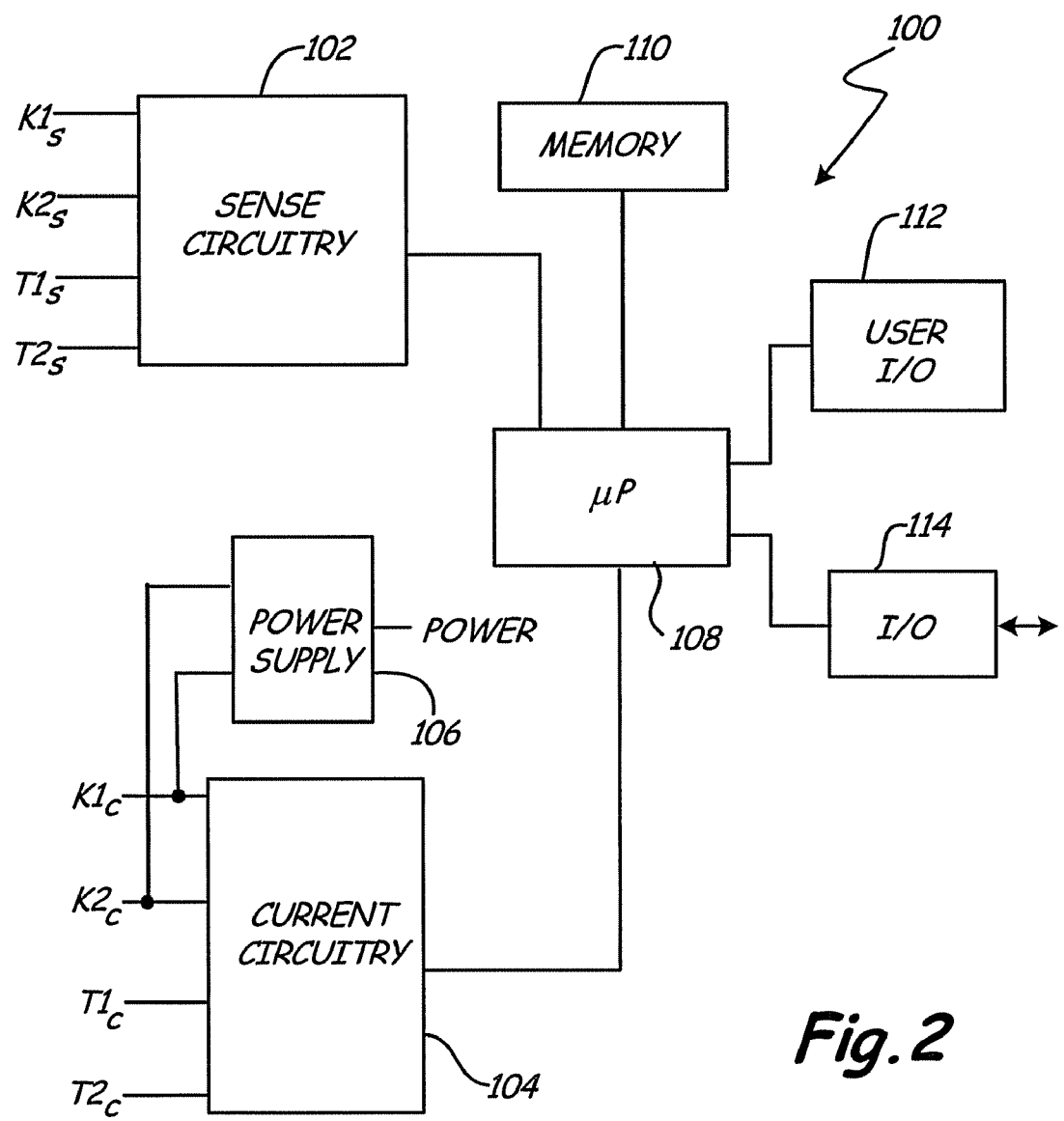
FIG. 2 is a simplified block diagram showing an automotive vehicle electrical system tester in accordance with one example embodiment of the present invention.

FIG. 2 is a simplified block diagram of automotive vehicle electrical system tester 100 in accordance with one example embodiment of the present invention. Tester 100 includes sense circuitry 102 which couples to connections $K1_S$, $K2_S$, $T1_S$ and $T2_S$. Similarly, tester 100 includes current drive circuitry 104 which connects to $K1_C$, $K2_C$, $T1_C$ and $T2_C$. Power supply circuitry 106 also couples to $K1_C$ and $K2_C$ and provides a power output which may be used for powering electrical components of tester 100. In another example embodiment, tester 100 includes a separate power source such as an internal battery. A microprocessor 108 couples to sense circuitry 102 and current circuitry 104 and operates in accordance with instructions stored in a memory 110. Memory 110 can include both volatile and non-volatile memory and may be used for permanently or temporarily storing information. User input/output circuitry 112 is shown coupled to microprocessor 108 and may includes for example, button inputs, a display for output, audio inputs and outputs, etc. Such audio inputs or outputs can include a voice output or input, alarms, beepers, buzzers, etc. FIG. 2 also illustrates I/O circuitry 114 which can be optionally used by microprocessor 108 to communicate with any other type of device including network communications, other diagnostic components, centralized locations, printers, etc. In one example configuration, this includes a connection for coupling to the databus of the vehicle 12. For example, this could be an OBD II type databus.

The load 22 of the vehicle can be any type of load including loads which draw high current levels, for example, a starter motor, a magnetic switch, a ground connection, wiring harness, a terminal which may be susceptible to corrosion, a connection through a bolt which may have inappropriate torque or otherwise provide a poor connection, data carrying wires, sensor wiring, trailer wiring, etc. The invention is applicable to all wire sizes including small, medium and large gauge and is not limited to those discussed herein. In one example embodiment, the output is related to a particular current draw through the cabling. For example, the output can comprise an indication that there is a 0.5 volt drop through the cable when carrying a 500 amp current. Such parameter can also be used, for example, in a pass/fail test, i.e., if the voltage drop is more than a particular threshold at a given current level, a failure indication can be provided as an output. In one embodiment, the measured parameters comprise dynamic parameters such as dynamic conductance. However, any dynamic parameter can be used in accordance with the present invention including dynamic resistance, reactance, impedance, conductance, susceptance, and/or admittance, including any combination of these parameters, or others.

Figure 3A:
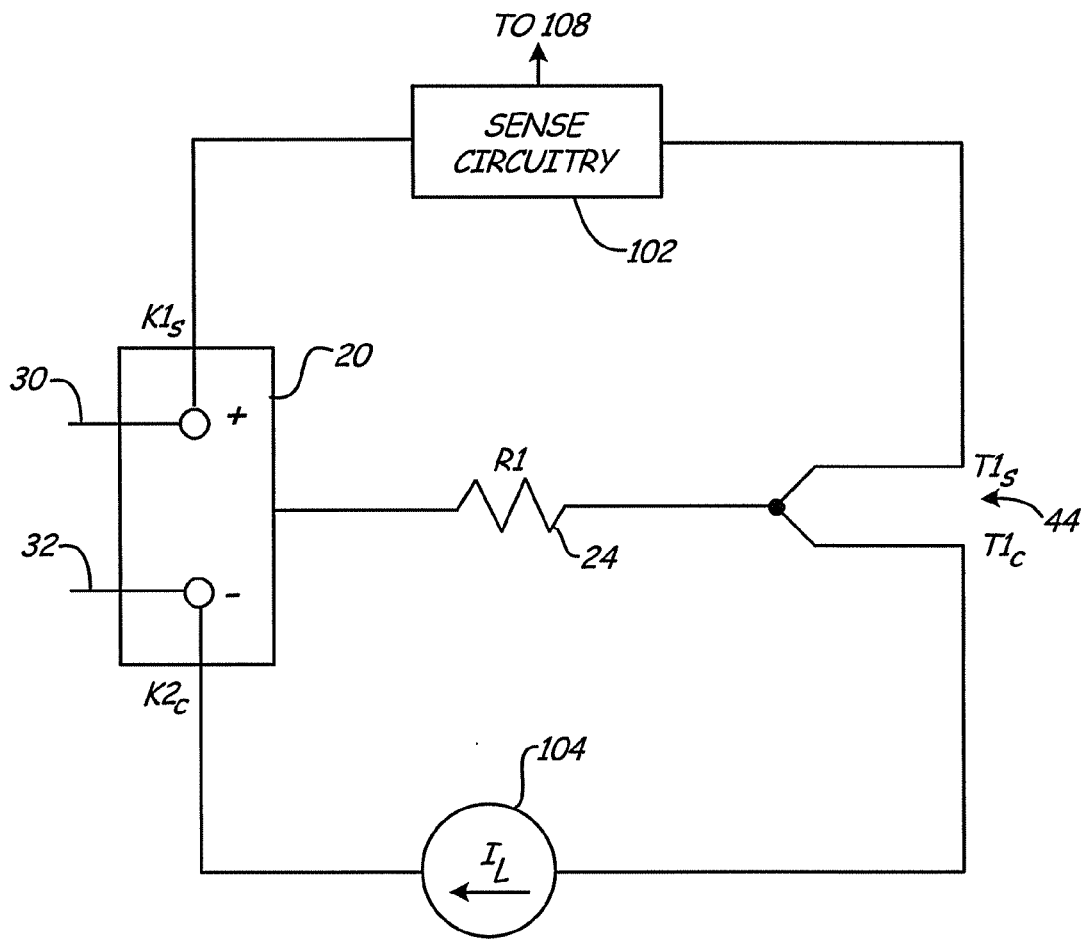
FIG. 3A is a simplified electrical diagram showing a configuration of circuitry for measuring a parameter of a wire of the vehicle.

FIG. 3A is a simplified block diagram showing the electrical connections to wiring 24 for measurement of resistance $R_1$. As illustrated in FIG. 3A, a current $I_L$ is applied by current source 104 through resistance $R_1$ of cable 24. The current $I_L$ flows through a current path from the positive terminal 30 of battery 20, through cable 24 and resistance $R_1$, and into test connector current connection $T1_C$ of test connector 44. The current source 104 provides a path for current from $Tl_C$ to the $K2_C$ connection of Kelvin connector 42. This, as illustrated in FIG. 3A, couples to the negative terminal 32 of battery 20. The current source 104 can be an active or passive current source. For example, current source 104 may be a resistive load which operates under the control of microprocessor 108. Sense circuitry 102 is coupled across resistance $R_1$ using the $K1_S$ sense connection of Kelvin connector 40 and the $T1_S$ sense connection of test connector 44. Note that as discussed herein, the test connections 44 and 46 are illustrated as Kelvin connections, however the invention is not limited to this configuration.

Figure 3B:
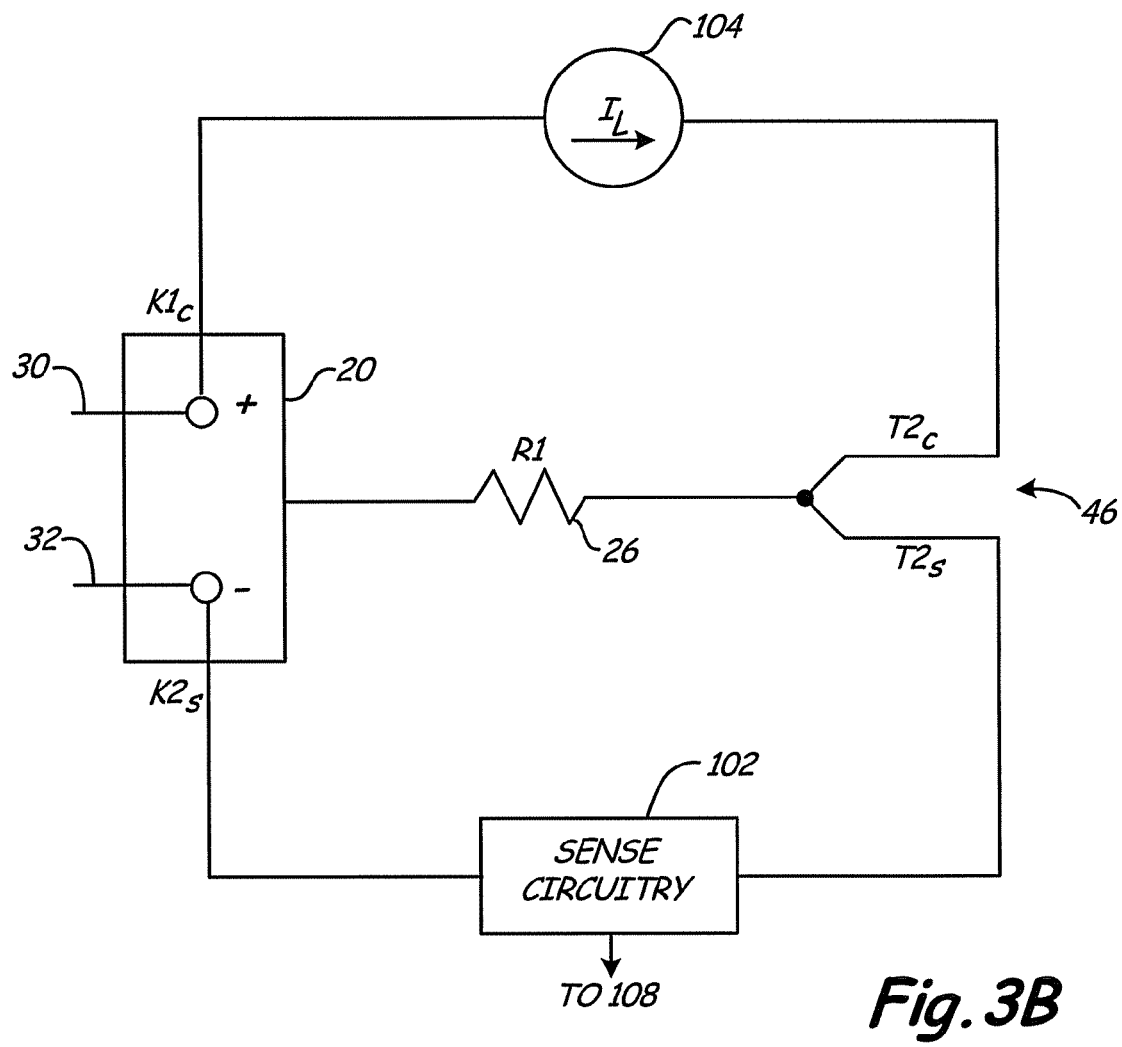
FIG. 3B is a simplified electrical diagram showing a configuration of circuitry for testing another wire of the vehicle.

FIG. 3B is a simplified block diagram showing a similar arrangement used to measure the resistance $R_2$ of cable 26. In FIG. 3B, a current $I_L$ is applied to resistance $R_2$ using current source 104 along with connection $K1_C$ of Kelvin connector 40 which couples to the positive terminal 30 of battery 20 and test connection $T2_C$ of test connector 46. A sense connection for sense circuitry 102 is provided by connector $K2_S$ of Kelvin connector 42 coupled to the negative terminal 32 of battery 20 along with the connector $T2_S$ of test connector 46.

Figure 4:
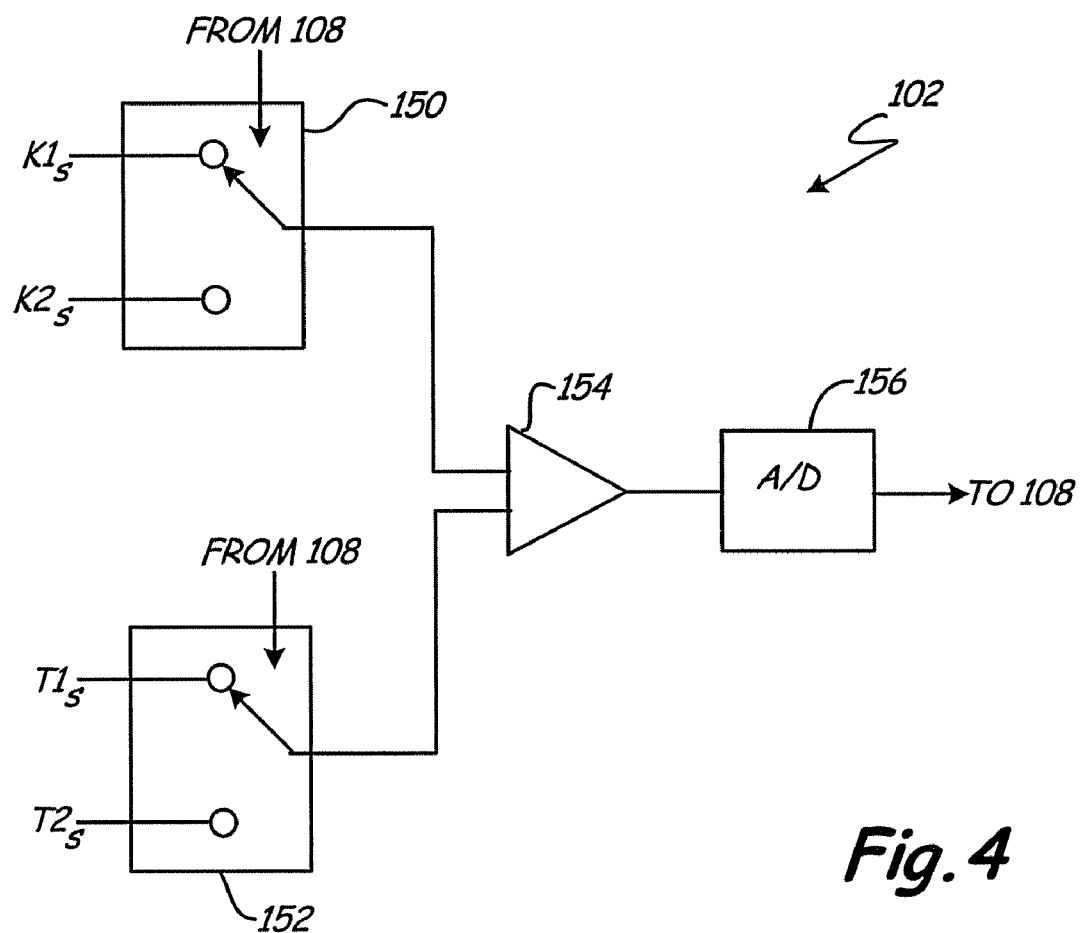
FIG. 4 is a simplified block diagram showing sense circuitry for use with the tester of FIG. 2.

FIG. 4 is simplified diagram showing one example configuration of sense circuitry 102. As illustrated in FIG. 4, sense circuitry 102 includes a multiplexor 150 operated under the control of microprocessor 108 which couples to the Kelvin sense connections $K1_S$ and $K2_S$. Multiplexor 150 is used to selectively couple one of the sense connections $K1_S$ and $K2_S$ to a differential amplifier 154. Similarly, a second multiplexor 152 operates under the control of microprocessor 108 and operates to selectively couple of the test sense connections $T1_S$ and $T2_S$ to the differential amplifier 154. Differential amplifier provides an amplified differential output to an analog to digital converter 156 which digitizes the analog signal and provides a digital signal to microprocessor 108. In one example configuration, the gain of the differential amplifier 154 maybe adjusted by microprocessor 108 to selectively increase or decrease the sensitivity of the circuitry.

Figure 5:
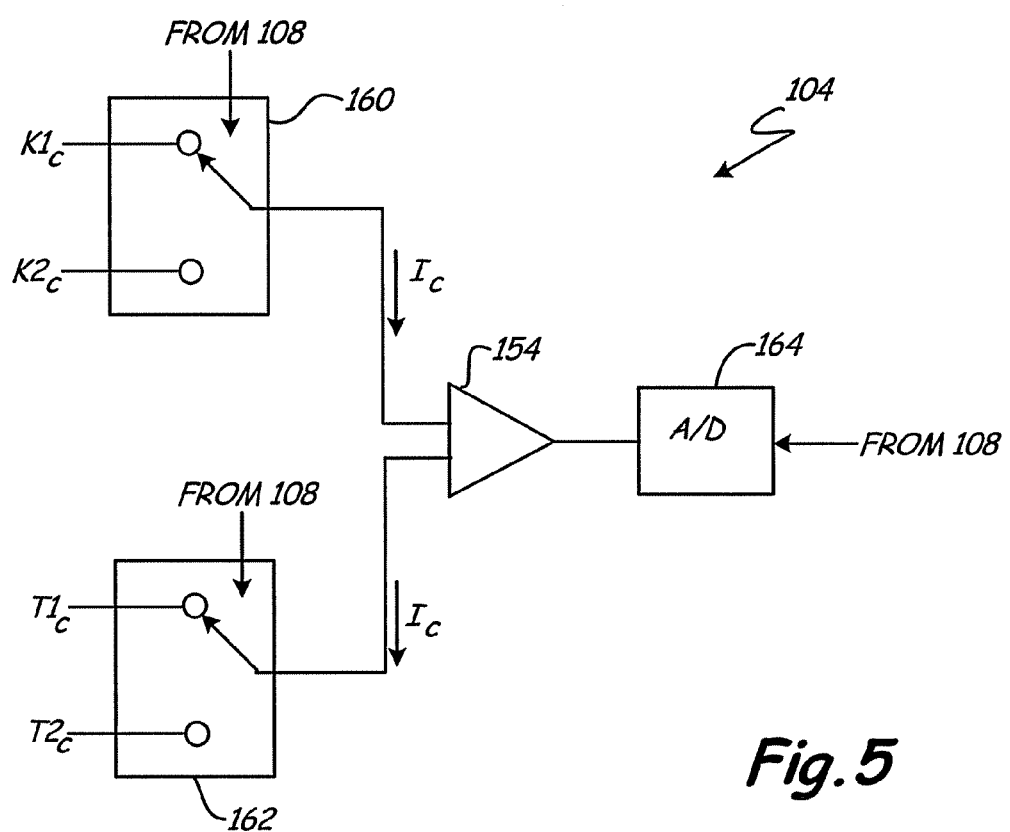
FIG. 5 is simplified block diagram showing current circuitry for use with the electrical system tester of FIG. 2.

FIG. 5 is a simplified block diagram showing one example embodiment of current circuitry 104 in greater detail. An embodiment illustrated in FIG. 5, a multiplexor 160 operates under the control of microprocessor 104 and selectively couples Kelvin connection $K1_C$ of Kelvin connector 40 or Kelvin connection $K2_C$ of Kelvin connector 42 to a current source 164. Similarly, a multiplexor 162 operates under the control of microprocessor 108 and selectively couples test current connection $T1_C$ of test connector 44 or test current connection $T2_C$ of test connector 46 to the current source 164. Current source 164 is coupled to microprocessor 108 and is controlled by microprocessor 108. Current source 164 may comprise, for example, a fixed resistance (in which case it is not necessary to connect current source 164 to microprocessor 108) or a plurality of selectable resistors or a variable resistance which provides a current path between one of the selected connectors coupled to multiplexor 160 and one of the connectors selected by multiplexor 162. In this configuration, the current source 164 is a passive current source formed by a resistance. However, an active current source may also be employed. Current 164 may also include current sense circuitry which is configured to measure a current $I_C$ flowing there through. This information can be provided to microprocessor 108 for use in determining the resistance of resistor $R_1$ or $R_2$ of cables 24 or 26, respectively.

During operation, microprocessor 108 shown in FIG. 2 controls operation of multiplexors 150, 152, 160 and 162 to arrange the test circuitry in the configuration illustrated in FIGS. 3A and 3B. The resistance being measured (R1 or R2) is calculated by microprocessor 108 using Ohms' law R=V/I where R is the resistance being measured, V is the voltage sensed by sense circuitry 102 and I is the current flowing through current circuitry 104. Operation by microprocessor 108 may be controlled by user I/O 112 shown in FIG. 2. For example, an operator may instruct the microprocessor 108 to initiate a measurement. In another example configuration, the operator instructs the microprocessor as to the amount of current $I_C$ to be applied during the test. This can be selected by the user, for example, based upon the type of wiring being measured, the specific use for the particular wiring being measured, the gauge of the wiring being measured, or other considerations as desired. The microprocessor 108 can provide an output, such as a pass/fail output by comparing the measured values with threshold levels. These threshold levels can be measured by a user through user I/O 112 and/or stored in memory 110. The particular thresholds may be changed based upon the particular test criteria being used. As discussed above, this could be based upon the particular wiring or cabling type, the use of which the wiring is applied, the gauge of the wiring, etc. Microprocessor 108 can also be configured to provide other information to the operator. For example, this includes any information which may be measured or otherwise retrieved by microprocessor 108 including voltage measures, maximum or minimum measurements, signal wave forms, user instructions or prompts, etc. In one example configuration, user I/O 112 may include an audible output such as voice prompting or verbal test results, or other sounds to instruct or provide information to an operator.

In one configuration, the user I/O 112 is used by an operator to instruct the microprocessor 108 as to the particular circuit configuration to be used as illustrated in FIGS. 3A and 3B. In another example configuration, for example, if a single test connector 44 or 46 is employed, microprocessor 108 measures a voltage using sense circuitry 102 between the test connection and Kelvin connectors 40 and/or 42. This measured voltage is used by microprocessor 108 to determine whether the test connector is coupled as showing by test connector 44 shown in FIG. 1 or if the test connector is coupled as shown by test connector 46 shown in FIG. 1. Based upon the measured voltage, microprocessor configures the circuitry in the proper configuration as illustrated in FIG. 3A or 3B.

Figure 6:
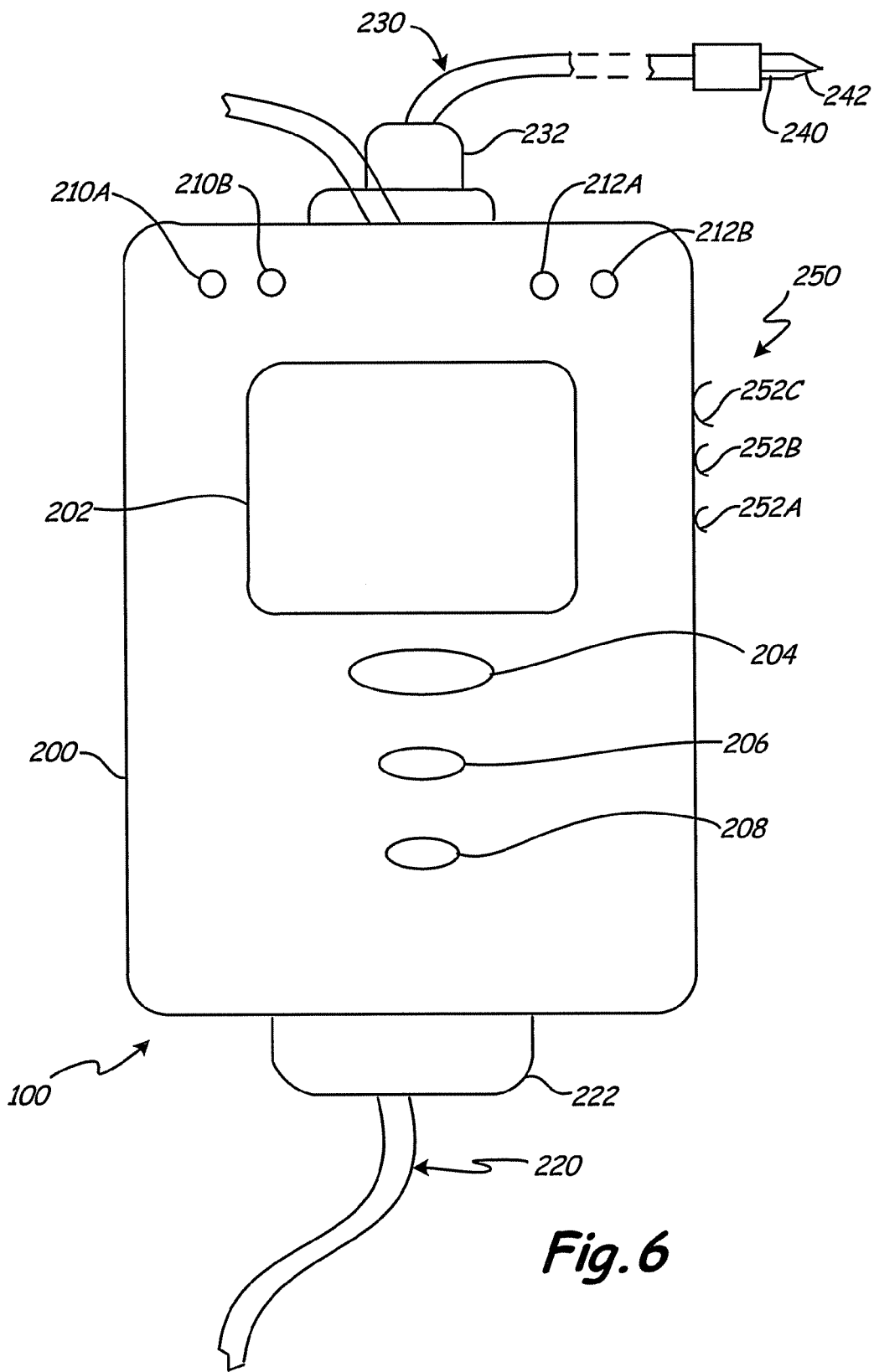
FIG. 6 is a front plan view of the electrical system tester of FIG. 2.

FIG. 6 is a plan view showing tester 100 which includes a housing 200 carrying a display 202 and user input buttons 204, 206 and 208. Display 202 and buttons 204-208 can comprise user I/O 112 shown in FIG. 2. Another example component of the user input/output 112 includes LED's 210A, 210B and 212A and 212B. A battery cable 220 couples to housing 200 to plug 222 and connects to Kelvin connectors 40 and 42 shown in FIG. 1. The Kelvin connectors 40 and 42 can comprise, for example, "alligator" type clamps for coupling to the terminals of battery 20. A test cable 230 couples to housing 200 to plug 232. In the example shown in FIG. 6, a distal end of test cable 230 comprises a piercing probe 242 configured to pierce through an insulation of a cable under test. Note that in such a configuration, the test connector, such as 44 or 46, may or may not be a Kelvin connection as illustrated in the above figures and may comprise a single connector. Some loss in accuracy may be expected however in some situations this may be acceptable. In another example configuration, the Kelvin connectors are provided through test cable 230 up to the distal end 240 of the test cable 230. At the distal end 240, the two Kelvin connectors are coupled together and a single connection is used for connecting to the cable under test. In yet another example configuration, the piercing probe 242 comprises two piercing probes such that a Kelvin connection is provided by piercing through the insulation of the cable. A piercing probe is not necessary and any type of test connection may be used including standard test probe configuration such as those available on volt meters, clamps, etc.

Button 204 can be configured as a "enter" button and buttons 206 and 208 can be configured as "up" and "down" buttons for scrolling through and selecting menu items displayed on display 208. For example, this can be used to also to receive information regarding the "gauge" of the wire under test. LED's 210 and 212A and 212B can be used to display test information. For example, when a wire of a positive polarity is detected either or both LED's 212 or 212B may be illuminated. Similarly, when test probe 242 is connected is wired to a wire of negative polarity, either or both of the LED 210A/210B may be illuminated. Button 204 can be used for initiate test button and cause the test to begin. Upon completion of the test, the microprocessor 108 can be configured to illuminate LED 210B or 212B if the test is successful. If the wire fails the test, LED 210A or 212B may be illuminated. In a similar configuration, an audio output can be provided, for example, a high pitch solid continuous tone to indicate a "good" wire, a "good" power wire, a high pitch beeping tone to indicate a "bad" power wire, a low pitch solid tone to indicate a "good" ground wire, and a low beeping tone to indicate a "bad" ground wire.

In another example configuration, a wire size gauge 250 is provided on the side of housing 200. In this example, the wire size gauge 250 provides three wire size gauges, 252A, 252B and 252C. These may be used by an operator to determine the gauge of the wire under test and input into the microprocessor 108 using user I/O 112. In another example configuration, wire size gauge 250 comprises an automatic gauge in which the wire under test is placed into a slot or the like and a sensor automatically determines the gauge of the wire and provides this information to microprocessor 108.

In one example configuration, a small gauge wire is tested with a current load of 1.25 amps, a medium gauge wire is tested with a current load of 2.5 amps, and a large gauge wire is tested with a current load of 5.0 amps, all with a fixed failure threshold of 0.2 volts. (i.e., if the measured voltage across the wire is greater than 0.2 volts, a failure is indicated). In another example embodiment, a fixed current load is provided and microprocessor 108 scales the measured result based upon the gauge of the wire.

Although the above description shows two different Kelvin connections to the battery terminals, in one configuration, Kelvin connections are not used and another example configuration, only a single Kelvin connection is used or no Kelvin connections are used. Similarly, only a single test connector may be employed and the invention does not require the two test connectors described above. Such an embodiment may be employed if desired, for example, to simultaneously measure the resistances of two separate wires. In a typical configuration, a single test connector will be employed. Similarly, the test connector may be a single connector and a Kelvin connection is not required. If a Kelvin connection is used, the Kelvin connection point can be configured anywhere along the test connector wiring and may be at a point that the test connector couples to the wiring of the vehicle, or at some other point in the wiring between the distal end of the test connector and the circuitry of the tester. The measurements may be made using static measurement techniques to obtain a static parameter or may be made using dynamic measurement techniques to obtain a dynamic parameter. Although the discussion above has generally referred to "resistance", the present invention is not limited to resistance and the parameter measured may be any parameter of the wire including those which have frequency dependent components. The tester may be powered with power from the battery of the electrical system or may contain an independent power source, for example, an internal battery. As discussed above, in some embodiments, Kelvin connections are provided to the terminals of the battery. In such a configuration, a parameter of the battery may be measured using the techniques discussed in the Background section, or other techniques.

The connection tip may be interchangeable and may be comprised a test probe, piercing tip, connector coupled to a particular type of electrical connection on the vehicle, or other configurations. As these tips are interchangeable, the overall resistance of the test connection may vary. Thus, in some configurations, the microprocessor 108 can be configured to implement a zeroing function whereby an operator can calibrate the measurement for the resistance of the wire based upon the selected probe tip. Such a configuration would typically not be required for a Kelvin connection. The zeroing function can be performed automatically by the microprocessor by measuring the resistance through the electrical connection, can be entered manually by an operator, may be selected by an operator scrolling through a table and selecting the probe in use. In such a configuration, memory 110 shown in FIG. 2 can contain information related to the resistance value for a particular probe.

In one configuration the measurement is presented to the operator in the form of "voltage drop at XX amps". However, the actual measurement may be performed at a current level other than that presented to the operator. If a small current is employed, conductance measurement techniques can be used to determine the voltage drop. If a current other than the displayed current is employed, the microprocessor 180 performs a scaling on the measurement. For example, if 5 amps is used to perform the measurement, the microprocessor 108 can compute the results of voltage drop at a different value such as 25 amps for display to the operator. This scaling can occur automatically, or can be selected by an operator. Such selection may be, for example, by scrolling through a utility menu presented to the operator using user I/O 110. In such a configuration, memory 110 can contain a scaling factor for use by the microprocessor 108.

In one embodiment, a relatively small current is employed. This reduces the amount of heat generated and reduces the power requirements of the testing device. The measurement can be performed using a dynamic forcing function such as a time varying current signal. For example, short pulses can be used if the device is not capable of sustaining a large current output for an extended period of time. In one example, a pulse width between 10 and 100 msec is used to perform the measurement.

The microprocessor can be configured to automatically sense the polarity of the connection. In such a configuration, the microprocessor sense the voltage measured and determines whether the probe is coupled to a power wire or to a ground wire and the appropriate load is applied. For example, if zero volts is sensed, the wire being tested is most likely a ground wire. Similar, if twelve volts is sensed, the wire being tested is most likely used to supply power. However, in some example configurations, a zero voltage reading may also indicate that the wire being tested is not connected. Similarly, a twelve volt reading may not be a power supplying wire if, for example, the alternator of the vehicle is generating a fifteen volt output. One example configuration to address this concern is to bias the probe tip to a voltage level. For example, circuitry within component 104 (or 102) can be provided to bias the probe tip to a value somewhere between the voltage at the two power leads coupled to the battery 20. When the probe tip is then coupled to the vehicle, the voltage at the probe tip will be pulled to either a more negative or positive value. Microprocessor 108 can sense this voltage and make a determination as to whether the probe is connected to a power lead or a ground lead. For example, if the probe tip voltage is within a predetermined voltage level from electrical ground, microprocessor can determine that the probe is connected to a ground connection. Similarly, if the probe tip is pulled within a predetermined voltage level from the plus connection of the battery, a microprocessor 108 can determine that a power lead is under test. In one example, the predetermined voltage is one volt which is advantageous if a protective diode is employed in the lead which would provide a voltage drop of 0.6 volts.

Although the present invention has been described with reference to preferred embodiments, workers skilled in the art will recognize that changes may be made in form and detail without departing from the spirit and scope of the invention. The measurements can be taken using multiple connections to the electrical system or by moving a single pair of connections to various positions on the electrical system. An output can be provided to instruct the operator where to place the connections.

What is claimed is:

1. A vehicle electrical system tester for testing the electrical system of a vehicle, the electrical system having wiring which couples a load to a battery, the vehicle electrical system tester configured to measure an electrical parameter of the wiring and comprising:
    a first battery terminal connection configured to couple to a first terminal of the battery;
    a second battery terminal connection configured to couple to a second terminal of the battery;
    a test connection configured to couple to a wire of the electrical system which is electrically connected between the first or second terminal of the battery and the load; and
    test circuitry coupled to the first and second battery terminal connections and the test connection, said test circuitry comprising a processor programmed to draw current from the battery along a path through the wire and the test connection and return the current to the battery, measure the electrical parameter of the wire with a sensor coupled to the test connection and responsibly provide an output based upon the electrical parameter and a measurement of a gauge of the wire.

2. The apparatus of claim 1 wherein the first battery terminal connection comprises a Kelvin connection.

3. The apparatus of claim 1 wherein the first and second battery terminal connections comprise Kelvin connections.

4. The apparatus of claim 1 wherein the test circuitry is powered with power from the first and second battery terminal connections.

5. The apparatus of claim 1 wherein the test connection comprises a Kelvin connection.

6. The apparatus of claim 1 wherein the test connection comprises a piercing probe configured to pierce insulation of the wire.

7. The apparatus of claim 1 wherein the test circuitry includes an adjustable load configured to adjust the current through the wire.

8. The apparatus of claim 1 including a display coupled to the test circuitry.

9. The apparatus of claim 1 including a user input coupled to the test circuitry.

10. The apparatus of claim 9 when the user input is configured to receive information related to the gauge of the wire.

11. The apparatus of claim 1 wherein the test circuitry is configured to control the current through the wire based upon a connection of the wire to the positive terminal of the battery or a connection of the wire to a negative terminal of the battery.

12. The apparatus of claim 1 further including a housing and wherein the housing includes a wire gauge.

13. The apparatus of claim 1 including an audio output coupled to the test circuitry.

14. The apparatus of claim 13 wherein the audio output comprises a voice output.

15. The apparatus of claim 1 wherein the test circuitry provides an output in the form of "voltage drop at XX amps" and wherein current drawn by the test circuitry has a value which is different than XX amps.

16. The apparatus of claim 1 wherein the test circuitry provides an output related to the electrical parameter of the wire and a scaling factor.

17. The apparatus of claim 1 wherein the electrical parameter of the wire comprises a dynamic parameter.

18. The apparatus of claim 1 wherein the test circuitry is configured to identify the wire as comprising a ground wire or a power wire.

19. The apparatus of claim 18 wherein the test connection is biased to a voltage level which is between a first battery terminal voltage and a second battery terminal voltage.

20. The apparatus of claim 1 wherein the test circuitry includes a zeroing function configured to compensate for resistance of the test connection.

21. The apparatus of claim 1 wherein the measurement of the gauge of the wire is based upon an automatic gauge configured to receive the wire and a sensor configured to determine the gauge of the wire.

22. A method of testing wiring an electrical system of a vehicle, the wiring extending between a load and a battery, the method comprising:
    coupling to a first battery terminal of the battery with a first battery terminal connection;
    coupling to a second battery terminal of the battery with a second battery terminal connection;
    coupling a test connection to a wire of the vehicle which electrically couples to the load;
    applying a current through the wire between the battery and the test connection;
    sensing a voltage drop across the wire between the battery and the test connection; and
    providing an output based upon the voltage drop and a measurement of a gauge of the wire.

23. The method of claim 22 wherein the first battery terminal connection comprises a Kelvin connection.

24. The method of claim 22 wherein the first and second battery terminal connections comprise Kelvin connections.

25. The method of claim 22 including powering test circuitry with power from the first and second battery terminal connections.

26. The method of claim 22 wherein the test connection comprises a Kelvin connection.

27. The method of claim 22 wherein the test connection comprises a piercing probe configured to pierce insulation of the wire.

28. The method of claim 22 including providing an adjustable load configured to adjust the current through the wire.

29. The method of claim 22 including displaying information based upon the sensed voltage drop.

30. The method of claim 22 including receiving a user input.

31. The method of claim 30 when the user input is related to the gauge of the wire.

32. The method of claim 22 including controlling the current through the wire based upon a connection of the wire to the positive terminal of the battery or a connection of the wire to a negative terminal of the battery.

33. The method of claim 22 including providing a housing and wherein the housing includes a wire gauge.

34. The method of claim 22 including providing an audio output based upon the sensed voltage circuitry.

35. The method of claim 34 wherein the audio output comprises a voice output.

36. The method of claim 22 wherein the measurement of the gauge of the wire is based upon an automatic gauge configured to receive the wire and a sensor configured to determine the gauge of the wire.

* * * * *

UNITED STATES PATENT AND TRADEMARK OFFICE
CERTIFICATE OF CORRECTION

PATENT NO. : 8,164,343 B2
APPLICATION NO. : 12/261336
DATED : April 24, 2012
INVENTOR(S) : Kevin I. Bertness It is certified that error appears in the above-identified patent and that said Letters Patent is hereby corrected as shown below:

IN THE CLAIMS:

Column 11:

At line 48 (claim 1), delete "responsibly" and insert -- responsively --

Signed and Sealed this
Nineteenth Day of March, 2013

Teresa Stanek Rea
*Acting Director of the United States Patent and Trademark Office*